United States Patent [19]
Tobita

[11] Patent Number: 6,052,324
[45] Date of Patent: Apr. 18, 2000

[54] SEMICONDUCTOR MEMORY DEVICE CAPABLE OF FAST SENSING OPERATION

[75] Inventor: Youichi Tobita, Hyogo, Japan

[73] Assignee: Mitsubishi Denki Kabushiki Kaisha, Tokyo, Japan

[21] Appl. No.: 09/359,047

[22] Filed: Jul. 23, 1999

[30] Foreign Application Priority Data

Feb. 17, 1999 [JP] Japan .................................. 11-038245

[51] Int. Cl.$^7$ ................................................. G11C 7/02
[52] U.S. Cl. ......................... 365/207; 365/205; 365/149
[58] Field of Search .................................. 365/207, 205, 365/149, 190

[56] References Cited

U.S. PATENT DOCUMENTS

| | | | |
|---|---|---|---|
| 4,951,256 | 8/1990 | Tobita | 365/208 |
| 5,007,024 | 4/1991 | Tanaka et al. | 365/207 |
| 5,471,425 | 11/1995 | Yumitori et al. | 365/190 |
| 5,570,047 | 10/1996 | Makino et al. | 365/189.09 |

OTHER PUBLICATIONS

"A 0.9 V Sense–Amplifier Driver for High–speed Gb–Scale DRAMs", K. Gotoh et al., 1996 Symposium on VLSI Circuits Digest of Technical Papers, pp. 108–109.

*Primary Examiner*—David Nelms
*Assistant Examiner*—Tuan T. Nguyen
*Attorney, Agent, or Firm*—McDermott, Will & Emery

[57] ABSTRACT

With bit lines connected to a sense amplifier, a sense drive line is overdriven to a level above a predetermined level via a coupling capacitance element, and is held at the predetermined voltage level after elapsing of a predetermined time period. Even with a low power supply voltage, a semiconductor memory device can perform sense operation at high speed.

17 Claims, 22 Drawing Sheets

F I G. 1
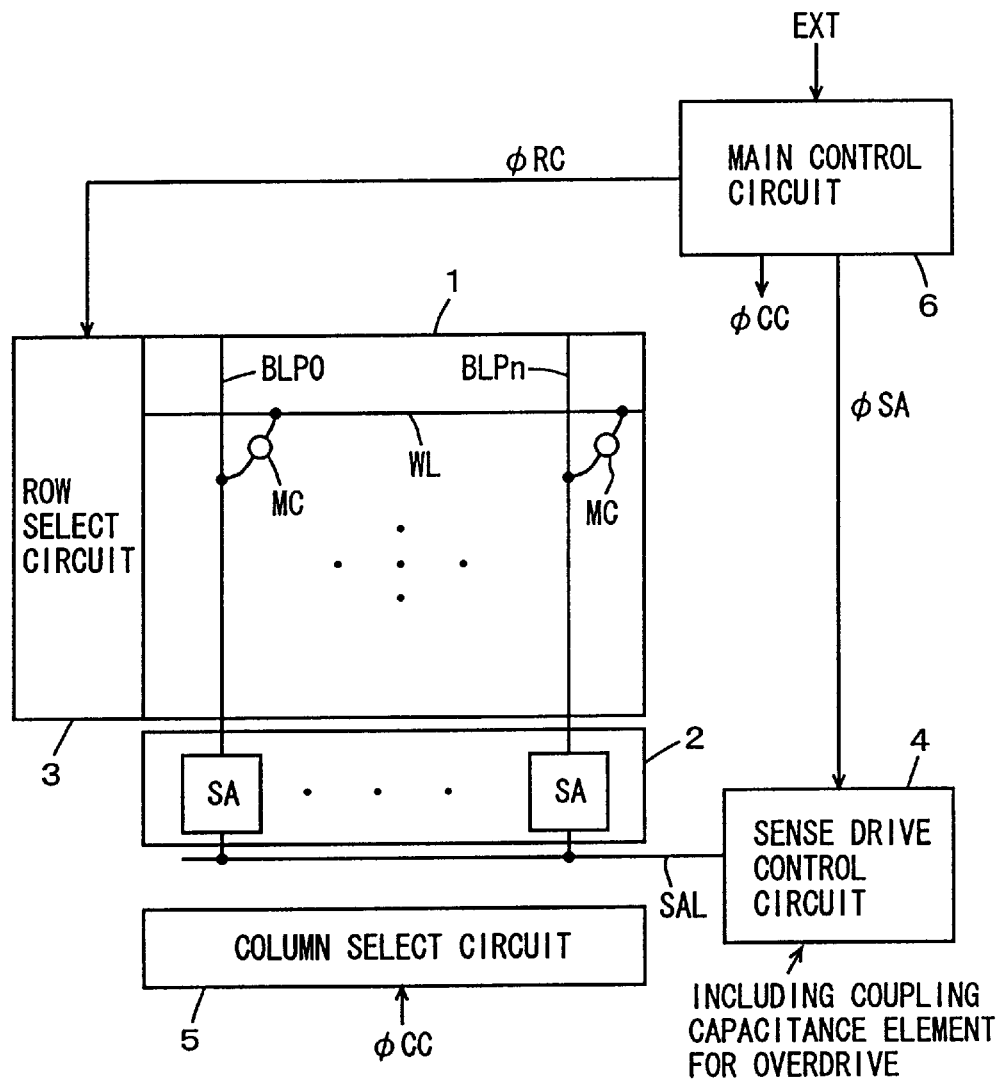

F I G. 3 0   PRIOR ART
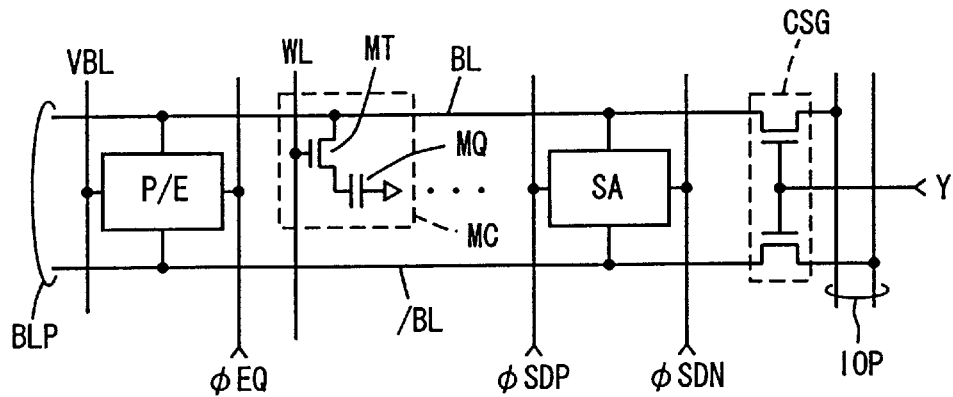
F I G. 3 1   PRIOR ART
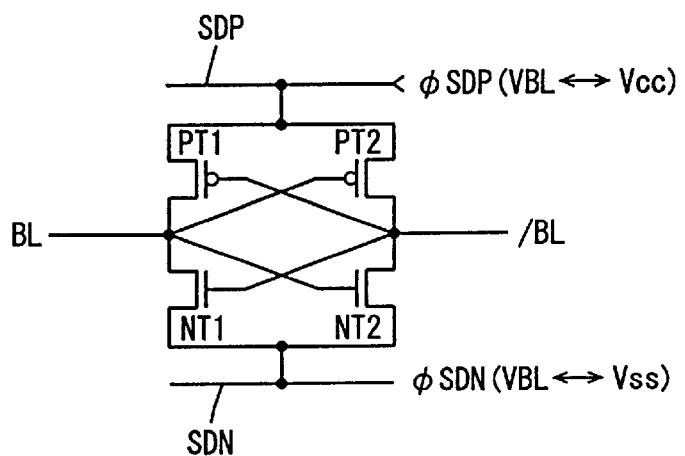

SEMICONDUCTOR MEMORY DEVICE CAPABLE OF FAST SENSING OPERATION

BACKGROUND OF THE INVENTION

1. Field of the Invention

The present invention relates to a semiconductor memory device, and particularly to a dynamic semiconductor memory device in which a memory cell has a capacitor. More specifically, the present invention relates to a method of driving sense amplifiers provided in a dynamic semiconductor memory device for sensing and amplifying memory cell data.

2. Description of the Background Art

FIG. 30 schematically shows a structure of a main portion of a dynamic semiconductor memory device in the prior art. In FIG. 30, a memory cell MC is arranged corresponding to a crossing between a word line WL extending in a row direction and a bit line pair BLP extending in a column direction. Each word line WL is connected to memory cells arranged in one row. Each bit line pair BLP including bit lines BL and /BL is connected to memory cells arranged in one column. FIG. 30 representatively shows memory cell MC arranged on the crossing between word line WL and bit line BL. Memory cell MC includes a memory cell capacitor MQ for storing information in the form of electric charges, and an access transistor MT formed of an n-channel MOS transistor for connecting memory cell capacitor MQ to bit line BL in response to a voltage on word line WL. The memory cell is not arranged on the crossing between word line WL and complementary bit line /BL paired with bit line BL.

For bit line pair BLP, a bit line precharge/equalize circuit P/E which precharges and equalizes bit lines BL and /BL to a predetermined precharge voltage VBL in response to activation of an equalize instructing signal φEQ, a sense amplifier SA which is activated in response to activation of sense drive signals φSDP and φSDN, to differentially amplify voltages on bit lines BL and /BL, and a column select gate CSG which connects bit line pair BLP to an internal data line pair IOP in response to a column select signal Y are further provided. Column select gate CSG includes transfer gates provided corresponding to bit lines BL and /BL, respectively.

Sense amplifier SA includes cross-coupled p-channel MOS transistors as well as cross-coupled n-channel MOS transistors. Operation will now be briefly described.

In a standby cycle, word line WL is at a ground voltage level, and access transistor MT in memory cell MC is off. Sense amplifier SA is inactive, and column select gate CSG is off. Equalize instructing signal φEQ is active so that bit line precharge/equalize circuit P/E is active to hold bit lines BL and /BL at predetermined voltage VBL level.

When a memory cycle starts, equalize instructing signal φEQ becomes inactive, and bit line precharge/equalize circuit P/E stops the operation of precharging and equalizing the bit lines. Bit lines BL and /BL are in a floating state at precharge voltage VBL level.

A row selecting operation is performed so that word line WL is driven to the selected state in accordance with an address signal, and a voltage level on word line WL rises. Responsively, access transistor MT is turned on so that memory cell capacitor MQ is electrically connected to bit line BL, and charges move between bit line BL and memory cell capacitor MQ. When data stored in memory cell MC is at H-level, the voltage level on bit line BL rises. When data stored in memory cell MC is at L-level, the voltage level on bit line BL lowers. Complementary bit line /BL holds the voltage level of precharged voltage VBL.

When the voltage difference between bit lines BL and /BL is adequately developed, sense drive signals φSDP and φSDN are driven to the active state, and sense amplifier SA differentially amplifies and latches the voltages on bit lines BL and /BL.

Then, column selection is performed. In this operation, column select signal Y is driven to the selected state in accordance with an address signal so that column select gate CSG is turned on to connect bit line pair BLP to internal data line pair IOP. Then, data is read from or written into memory cell MC.

In the dynamic semiconductor memory device, each memory cell MC is formed of one capacitor and one transistor, and therefore occupies a small area. Thus, the memory cell has a structure suitable to high-density integration, and dynamic semiconductor memory devices such as a DRAM (Dynamic Random Access Memory) have been widely used as semiconductor memory devices of large storage capacities.

With increase in integration density of the semiconductor memory device, sizes of elements are reduced. A power supply voltage must be lowered for ensuring breakdown characteristics of gate insulating films and others of components, i.e., MOS transistors (insulated gate field-effect transistors) having such reduced sizes. Reduction in element size is performed according to a predetermined scaling rule. In the MOS transistor, however, it is generally difficult to lower the threshold voltage in accordance with the power supply voltage which in turn is lowered in accordance with the predetermined scaling rule. This is due to the following fact. Even if MOS transistor has a gate-source voltage Vgs set at 0 V, a leakage current (sub-threshold current) flowing therethrough would increase with decrease in absolute value of the threshold voltage, and this leakage current would not be negligible. Accordingly, the absolute value of the threshold voltage is set to a predetermined value sufficiently reducing the sub-threshold leakage current.

FIG. 31 shows a structure of sense amplifier SA. In FIG. 31, sense amplifier SA includes a p-channel MOS transistor PT1 which is connected between a sense drive signal line SDP and bit line BL and has a gate connected to bit line /BL, a p-channel MOS transistor PT2 which is connected between sense drive signal line SDP and bit line /BL and has a gate connected to bit line BL, an n-channel MOS transistor NT1 which is connected between a sense drive signal line SDN and bit line BL and has a gate connected to bit line /BL, and an n-channel MOS transistor NT2 which is connected between sense drive signal line SDN and bit line /BL and has a gate connected to bit line BL.

Sense drive signal line SDP transmits sense drive signal φSDP, and sense drive signal line SDN transmits sense drive signal φSDN. Sense drive signal φSDP has an amplitude between VBL and Vcc, and sense drive signal φSDN has an amplitude between VBL and Vss. When sense drive signal φSDP is active (at power supply voltage Vcc level), p-channel MOS transistors PT1 and PT2 drive one of bit lines BL and /BL at a higher potential to power supply voltage Vcc level. When sense drive signal φSDN is active (at ground voltage Vss level), n-channel MOS transistors NT1 and NT2 drive the other bit line BL or /BL at the lower potential to ground voltage Vss level.

In a general sense operation, sense drive signal φSDN is first activated, and then sense drive signal φSDP is activated.

When bit lines BL and /BL have been precharged to the voltage level of intermediate voltage VBL (=Vcc/2), the gate-source voltages of n-channel MOS transistors NT1 and NT2 take (ΔV+Vcc/2) as the maximum value, where ΔV represents a read voltage read onto the bit line. When the voltage level of power supply voltage Vcc lowers, the gate-source voltages of n-channel MOS transistors NT1 and NT2 lower, and the driving power lowers because the current driving power of the MOS transistor depends on the gate-source voltage. Consequently, the fast sense operation cannot be implemented. Likewise, a drain-source voltage Vds lowers, and a drain current decreases so that fast charging/discharging (sensing) cannot be implemented.

Likewise, p-channel MOS transistors PT1 and PT2 amplify the bit line voltage difference enlarged by the above sense operation of n-channel MOS transistors NT1 and NT2. However, when power supply voltage Vcc is low, the maximum value Vcc of the gate-source voltages of p-channel MOS transistors PT1 and PT2 is low so that fast sensing (restoring) cannot be done.

In 64-Mbit DRAMs in the present generation, one bit line pair is connected to the memory cells of 126 bits. In DRAMs in the next generation, 256 memory cells are connected to one bit line, and the bit line capacitance increases. Accordingly, the bit line load cannot be driven fast under the low power supply voltage condition, and therefore fast access cannot be achieved.

Various structures have been proposed for implementing fast sensing with the low power supply voltage.

FIG. 32A schematically shows a structure of a sense drive control circuit in the prior art. In FIG. 32A, bit lines BL and /BL are divided into cell bit lines BLC and /BLC and sense bit lines BLS and /BLS with a bit line isolating gate BIG. Memory cell MC is connected to cell bit lines BLC and /BLC. Sense amplifier SA is connected to sense bit lines BLS and /BLS. Bit line isolating gate BIG is supplied with a bit line isolation control signal /φBI via an inverter IV1.

Sense amplifier SA includes cross-coupled p-channel MOS transistors PT1 and PT2 as well as cross-coupled n-channel MOS transistors NT1 and NT2, similarly to the structure shown in FIG. 31. A sense drive line SALa is connected to a source node SPL of sense amplifier SA, and a sense drive line SALb is connected to a source node SNL of sense amplifier SA.

Sense drive line SALa includes a boost capacitance Csp which receives a boost control signal fBSP on one electrode thereof, an n-channel MOS transistor PR3 which is turned on to transmit intermediate voltage Vcc/2 when sense activating signal /φLP is inactive, and a p-channel MOS transistor PR3 which is turned on to transmit power supply voltage Vcc when sense activating signal /φLP is active. Sense drive line SALb is connected to a boost capacitance Csn which receives a boost control signal φBSN on one electrode thereof, an n-channel MOS transistor NR4 which is turned on to transmit intermediate voltage Vcc/2 when sense activating signal /φLN is inactive, and an n-channel MOS transistor NR5 which receives sense activating signal /φLN on a gate thereof via an inverter IV2 and is turned on to transmit ground voltage Vss when sense activating signal /φLN is active (L-level). Operation of the sense drive control circuit shown in FIG. 32A will now be described with reference to a signal waveform diagram of FIG. 32B.

In a standby cycle, isolation control signal /φBI is at L-level, the output signal of inverter IV1 is at H-level, and bit line isolating gate BIG is on. Therefore, cell bit lines BLC and /BLC are connected to sense bit lines BLS and /BLS, respectively. Boost control signal φBSP is at the ground voltage level, and boost control signal φBSN is at power supply voltage Vcc level. Sense drive lines SALa and SALb are already precharged to the voltage level of intermediate voltage of Vcc/2 by MOS transistors NR3 and NR4. Likewise, bit lines BL and /BL are already precharged to the voltage level of intermediate voltage of Vcc/2 by the bit line precharge/equalize circuit (see FIG. 30).

When a memory cycle starts, word line WL is first driven to the selected state in accordance with a row address signal. As the voltage on word line WL rises, data stored in memory cell MC is transmitted onto bit lines BLC and BLS (FIG. 32B shows the signal waveforms in the operation of reading data at H-level). Since bit lines /BLC and /BLS are not connected to the memory cell, they maintain the level of intermediate voltage of Vcc/2.

When the voltage difference between sense bit lines BLS and /BLS increases, bit line isolation control signal /φBI attains H-level at a predetermined timing, bit line isolating gate BIG is turned off, and sense bit lines BLS and /BLS are isolated from cell bit lines BLC and /BLC, respectively. The memory cell is not connected to sense bit lines BLS and /BLS, and the load driven by sense amplifier SA is sufficiently small. At substantially the same time as turn-off of bit line isolating gate BIG, sense activating signals /φLN and /φLP are driven to the active state at Llevel. Thereby, MOS transistors NR3 and NR4 are turned off, and MOS transistors PR3 and NR5 are turned on.

Sense drive line SALb is supplied with ground voltage Vss, and MOS transistors NT1 and NT2 discharge one (/BLS) of sense bit lines BLS and /BLS at a lower potential to the ground voltage level. Sense drive line SALa is supplied with power supply voltage Vcc, and MOS transistors PT1 and PT2 drive sense bit line BLS to the level of power supply voltage Vcc. During the sense operation of sense amplifier SA, only sense bit lines BLS and /BLS are driven. Therefore, the load driven by the sense amplifier SA is merely formed of parasitic capacitances of sense bit lines BLS and /BLS as well as parasitic capacitances such as junction capacitances of MOS transistors NT1, NT2, PT1 and PT2. Accordingly, the load is sufficiently small, and the sense operation can be performed fast even if the voltage level of power supply voltage Vcc is low.

After sense amplifier SA completes the sense operation, isolation control signal /φBI is driven to L-level at a predetermined timing, and bit line isolating gate BIG is turned on to connect bit lines BLC and BLS and to connect complementary bit lines /BLC and /BLS. At this time, boost control signal φBSP is driven from the ground voltage level to the power supply voltage level, and boost control signal φBSN is driven from the power supply voltage level to the ground voltage level. That is, sense drive lines SALa and SALb are overdriven, the voltage level on sense drive line SALa exceeds power supply voltage Vcc, and the voltage level on sense drive line SALb becomes lower than ground voltage Vss. By overdriving sense drive lines SALa and SALb, electric charges can be fast supplied to suppress variations in voltage level on sense bit lines BLS and /BLS even in the case where the variation in voltage level may occur on sense bit lines BLS and /BLS due to connection of sense bit lines BLS and /BLS to cell bit lines BLC and /BLC, respectively. Thereby, restoring of data into memory cell MC can be precisely and reliably performed.

After completion of the restoring, access to a memory cell (column selection) is performed, and data is written or read.

According to the method of isolating the sense amplifier and overdriving the sense drive lines as shown in FIG. 32A, it is necessary to determine accurately the timing for turning off bit line isolating gate BIG and starting the sense operation. If bit line isolating gate BIG were turned off at a fast timing for implementing fast sense operation, an adequate voltage difference would not occur between sense bit lines BLS and /BLS, and accurate sensing would be impossible. If bit line isolating gate BIG were turned off after start of the sense operation, the load to be driven by sense amplifier SA would be large, and therefore fast sensing would be impossible. As the simplest approach, the sensing start timing (i.e., timing for activating sense activating signal /$\phi$LN) may be set the same as the timing for turning off bit line isolating gate BIG. Even in this case, however, bit line isolating gate BIG and sense amplifier SA are driven by different control signals, and an appropriate timing margin is required for activating sense amplifier SA under a low load. Accordingly, timing control is difficult, and it is difficult to perform sense operation at high speed.

Further, restoring is required after the sensing, and the period for the restoring increases the time period of the memory cycle, which also impedes fast access.

SUMMARY OF THE INVENTION

An object of the invention is to provide a semiconductor memory device which can easily achieve fast sensing even with a lower power supply voltage.

Another object of the invention is to provide a semiconductor memory device which does not particularly require a restoring time, to reduce a time period of a memory cycle.

Still another object of the invention is to provide a semiconductor memory device which can easily achieve fast accessing with a low power supply voltage without increasing an occupying area.

According to the invention, a semiconductor memory device includes a plurality of memory cells arranged at least in one column, a bit line pair connected to the memory cells arranged in one column, a sense amplifier coupled to a bit line pair for differentially amplifying the voltages on the bit line pair in accordance with the voltage on a sense drive line, and a sense drive control circuit coupled to the sense drive line and responsive to activation of a sense instructing signal for overdriving the sense drive line to a level exceeding a predetermined voltage level for a predetermined period through capacitance coupling operation of a coupling capacitance element, and thereafter holding the sense drive line at the predetermined voltage. The bit line pair and the sense amplifier are continuously connected together at least during the active state of the sense instructing signal.

Since the sense amplifier is activated while connecting the bit line and the sense amplifier, the restore operation is performed simultaneously with the sense operation. Therefore, an independent restoring cycle is not required so that the memory cycle can be reduced in time period.

By overdriving the sense drive line in the sense operation, it is possible to suppress consumption of a sense amplifier current during the sensing, and the sense operation can be performed stably. The sense amplifier transistor can drive the bit line with a large drive power so that the sense operation can be performed fast. Thereby, the bit line voltage can be made definite at a fast timing even with a low power supply voltage so that column select timing can be made fast, and fast access can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows a whole structure of a semiconductor memory device according to the invention;

FIG. 30 schematically shows a structure of an array in a conventional semiconductor memory device;

FIG. 31 shows an example of a structure of a sense amplifier in the prior art.

DESCRIPTION OF THE PREFERRED EMBODIMENTS

Embodiment 1

Figure 2:
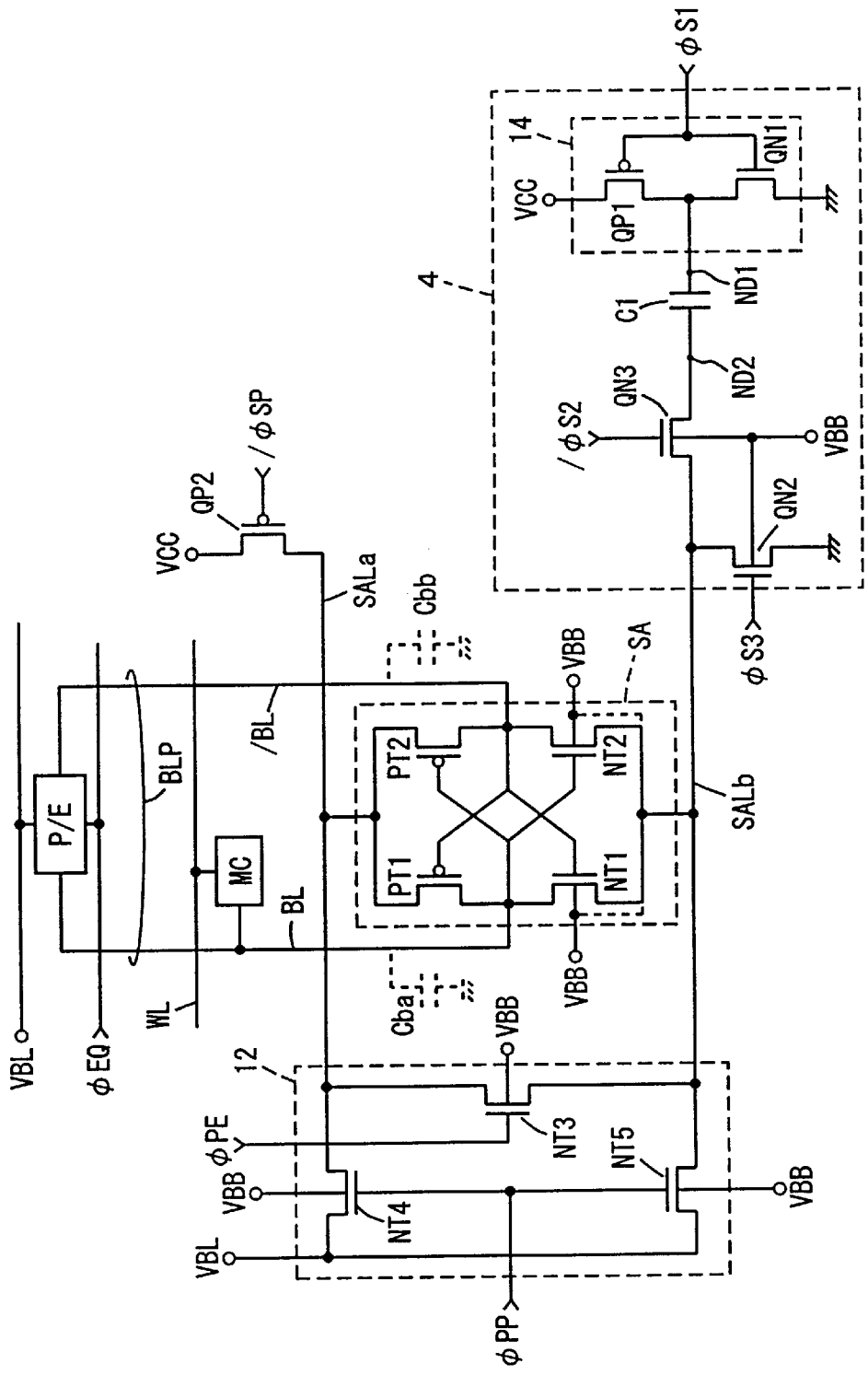
FIG. 2 shows a structure of a main portion of the semiconductor memory device according to an embodiment 1 of the invention.

FIG. 1 schematically shows a whole structure of a semiconductor memory device according to an embodiment 1 of the invention. In FIG. 1, the semiconductor memory device includes a memory array 1 having a plurality of memory cells MC arranged in rows and columns. In memory cell array 1, bit line pairs BLP0–BLPn are arranged corresponding to the columns of memory cells MC, and word lines WL are arranged corresponding to the rows of memory cells MC. In FIG. 1, one word line WL is shown representatively.

The semiconductor memory device further includes a sense amplifier group 2 which includes sense amplifiers SA provided corresponding to bit line pairs BLP0–BLPn respectively, a row select circuit 3 for driving a word line corresponding to an addressed row in memory array 1 to the selected state when activated, a sense drive control circuit 4 for driving a sense drive line SAL provided commonly to sense amplifiers SA in sense amplifier group 2 when active, a column select circuit 5 for selecting a bit line pair (or sense amplifier) corresponding to an addressed column to connect the same to an internal data bus (not shown) when active, and a main control circuit 6 for selectively activating row select circuit 3, sense drive control circuit 4 and column select circuit 5 in accordance with an externally applied control signal EXT.

Main control circuit 6 activates a row selection instructing signal φRC for application to row select circuit 3 when row selection is instructed in accordance with external control signal EXT. When column selection (or data write/read) is instructed, main control circuit 6 activates a column selection instructing signal φCC for application to column select circuit 5. When row selection is instructed, main control circuit 6 activates a sense operation instructing (activating) signal φSA for application to sense drive control circuit 4 at a predetermined timing.

Sense drive control circuit 4 includes a coupling capacitance element, and operates in accordance with activation of sense operation instructing signal φSA to overdrive sense drive line SAL via the coupling capacitance element to an extent exceeding a predetermined voltage level at an initial stage of the sense operation. Thereby, sense drive control circuit 4 can prevent reduction of the sense power supply voltage at the time of start of the sense operation, and enables fast sensing. After a predetermined time elapses, the sense drive line SAL is held at the predetermined voltage level. Thereby, current consumption can be reduced, and the bit line voltage can be made stable.

Sense amplifiers SA of sense amplifier group 2 differentially amplify the voltages on corresponding bit line pairs BLP0–BLPn in accordance with the voltage on sense drive line SAL. Bit line pairs BLO0–BLPn are directly coupled to corresponding sense amplifiers SA, and are driven in accordance with sense amplifiers SA in the sense operation by sense amplifiers SA. Therefore, a dedicated restoring cycle is not required, and a cycle time can be reduced.

FIG. 2 shows a structure of sense drive control circuit 4 and sense amplifier group 2 shown in FIG. 1. FIG. 2 shows only one sense amplifier SA representatively.

Figure 32A:
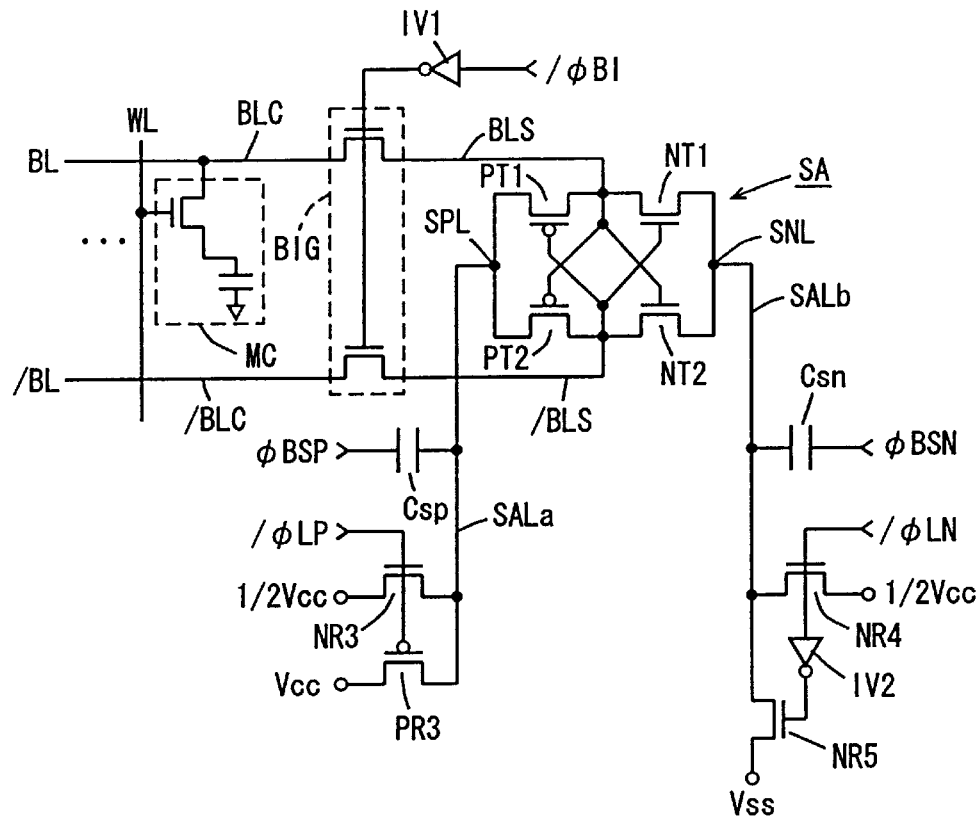
FIG. 32A shows another structure of a conventional semiconductor memory device.
Figure 32B:
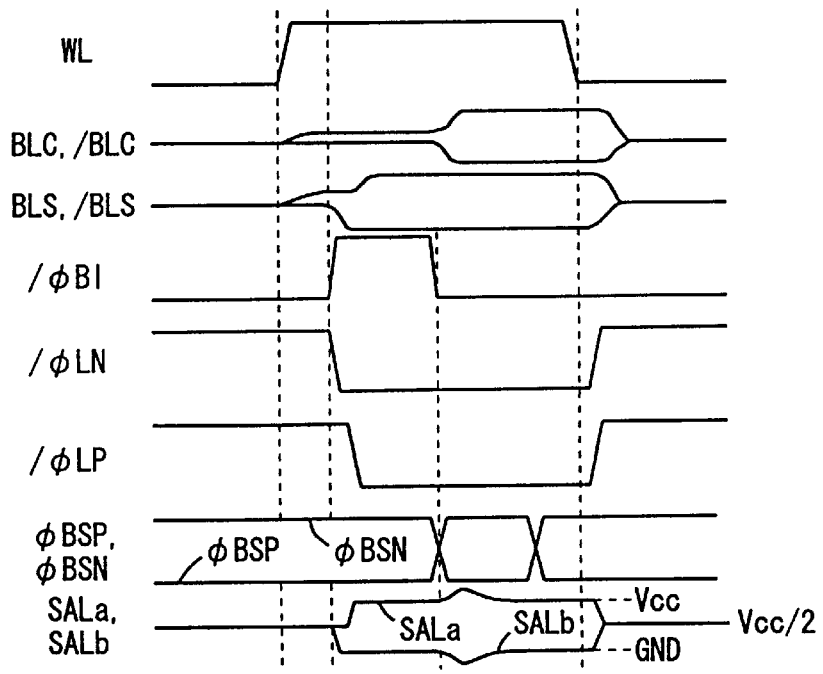
FIG. 32B is a signal waveform diagram representing operations of the structure shown in FIG. 32A.

Bit line pair BLP includes bit lines BL and /BL. Similarly to the prior art device, bit line pair BLP is provided with a bit line precharge/equalize circuit P/E for precharging and equalizing bit lines BL and /BL to a predetermined voltage VBL in response to activation of a bit line equalize instructing signal φEQ. Memory cell MC is arranged corresponding to a crossing between bit line BL and word line WL. Memory cell MC has the same structure as that shown in FIG. 32, and is formed of one memory capacitor and one access transistor.

Sense drive line SAL for sense amplifier SA includes a pair of sense drive lines SALa and SALb. Similarly to conventional sense amplifier SA shown in FIG. 32, sense amplifier SA includes cross-coupled p-channel MOS transistors PT1 and PT2 as well as cross-coupled n-channel MOS transistors NT1 and NT2. In this embodiment 1, sense drive line SALb is overdriven to a negative voltage level exceeding the ground voltage so that n-channel MOS transistors NT1 and NT2 of sense amplifier SA are supplied on their back gates with a negative voltage VBB. This prevents conduction between substrate regions (back gates) and sources of MOS transistors NT1 and NT2 during the overdriving.

A sense precharge/equalize circuit 12 is provided for sense drive lines SALa and SALb, for precharging and equalizing sense drive lines SALa and SALb to an intermediate voltage VBL equal to VCC/2 in a standby cycle. Sense precharge/equalize circuit 12 includes an n-channel MOS transistor NT3 which is turned on to short-circuit sense drive lines SALa and SALb in response to activation of equalize instructing signal φPE, and n-channel MOS transistors NT4 and NT5 which are turned on to transmit intermediate voltage VBL (=VCC/2) onto sense drive lines SAL1 and SALb in response to activation of precharge instructing signal φPP. MOS transistors NT3, NT4 and NT5 are supplied on their back gates with bias voltage VBB. The structure of sense precharge/equalize circuit 12 is the same as that of bit line precharge/equalize circuit P/E, although these circuits receive different control signals.

Sense drive control circuit 4 includes a driver 14 for driving a node ND1 in accordance with a sense drive control signal φS1, a coupling capacitance element C1 arranged between nodes ND1 and ND2 for transmitting the output signal of driver 14 onto node ND2 by capacitance coupling, an n-channel MOS transistor QN3 for electrically connecting node ND2 to sense drive line SALb in accordance with a sense drive control signal φS2, and an n-channel MOS transistor QN2 for transmitting the ground voltage onto sense drive line SALb in accordance with a sense drive control signal φS3. MOS transistors QN2 and QN3 are supplied on their back gates with bias voltage VBB. Sense drive line SALa is provided with a p-channel MOS transistor QP2 for transmitting power supply voltage VCC onto sense drive line SALa in accordance with sense control signal /φSP.

Parasitic capacitances Cba and Cbb are associated with bit lines BL and /BL. Sense amplifier SA is always connected to bit lines BL and /BL, and drives parasitic capacitance when active. Operations of the circuits shown in FIG. 2 will now be described with reference to a signal waveform diagram of FIG. 3.

Upon standby, precharge instructing signal $\phi$PP is at power supply voltage VCC level, and equalize instructing signals $\phi$PE and $\phi$EQ are also at power supply voltage VCC level. Therefore, bit lines BL and /BL as well as sense drive lines SALa and SALb are held at intermediate voltage VBL level by corresponding precharge/equalize circuits P/E and 12.

When a memory cycle starts (when the instruction of starting selection of a memory cell row is applied), precharge instructing signal $\phi$PP as well as equalize instructing signals $\phi$PE and $\phi$EQ lower to the voltage level of negative voltage of $-$VCC/2. Bit line equalize instructing signal P/E is deactivated so that bit lines BL and /BL are electrically floated at intermediate voltage VBL level. Precharge/equalize circuit 12 is also deactivated so that MOS transistors NT3–NT5 are turned off, and sense drive lines SALa and SALb are electrically floated at intermediate voltage VBL level (time t1).

Then, row select circuit 3 shown in FIG. 1 performs the row selection so that the voltage level on word line WL corresponding to an addressed row rises at time t2. Usually, the selected word line WL is driven to the voltage level higher than power supply voltage VCC (for the purpose of preventing a threshold voltage loss across the access transistor in memory cell MC, and fast transfer of charges between the memory capacitor and bit line BL).

Figure 3:
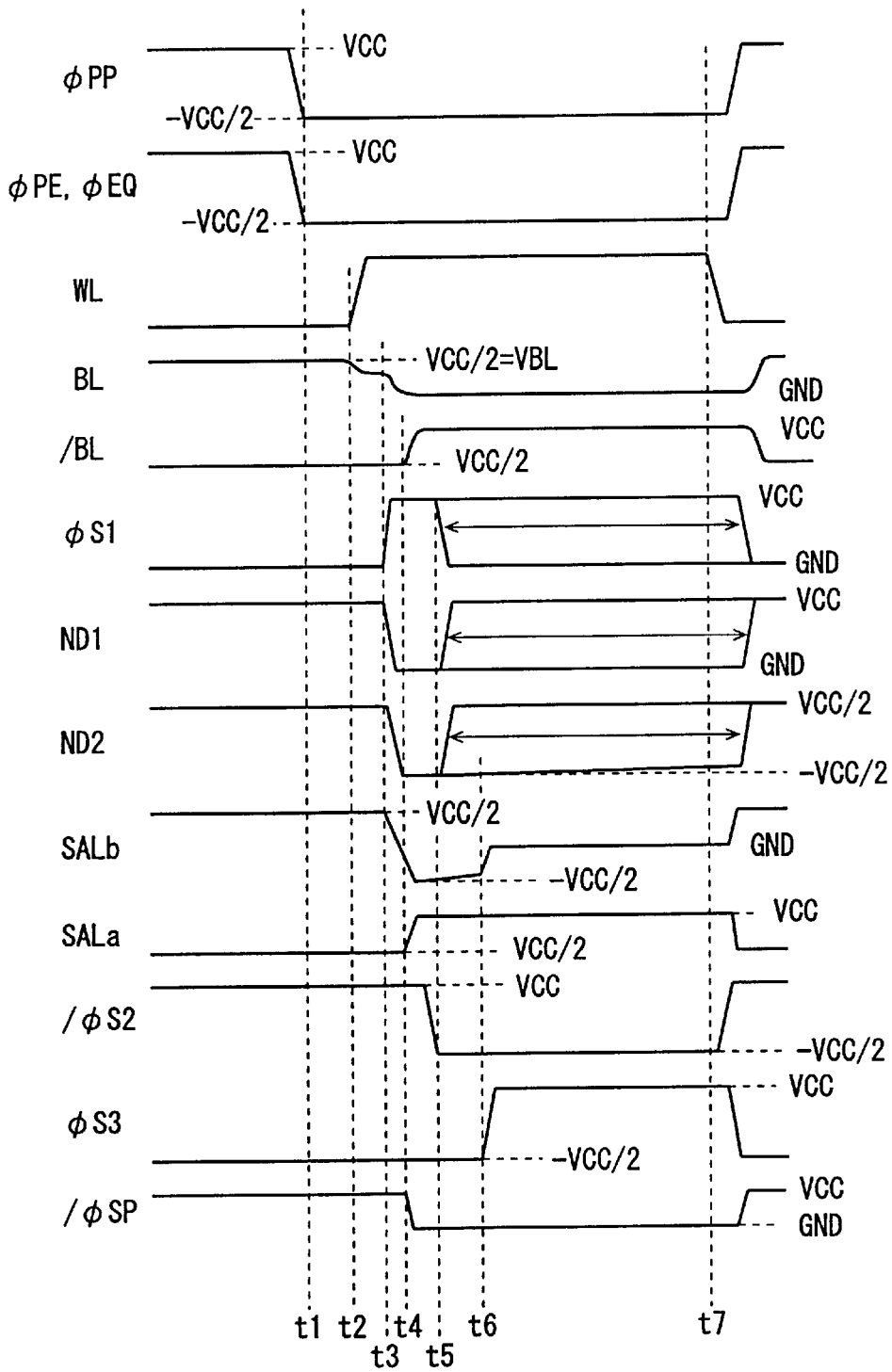
FIG. 3 is a signal waveform diagram representing operations of the structure shown in FIG. 2.

At time t2, the voltage level on word line WL rises so that data stored in memory cell MC is read onto bit line BL. FIG. 3 shows signal waveforms in the case where the data stored in memory cell MC is at L-level (ground voltage level). In the case of the L-level data, the voltage level on bit line BL lowers from precharged voltage VBL. However, bit line /BL holds the voltage level of precharged voltage VBL (=VCC/2) because it is not connected to memory cell MC.

At time t3, when the voltage on bit line BL changes by a predetermined value or more, sense drive control signal $\phi$S1 rises from ground voltage GND level to power supply voltage VCC level. Thereby, driver 14 lowers the voltage level on node ND1 from power supply voltage VCC level to ground voltage GND level. This voltage change on node ND1 is transmitted to node ND2 via coupling capacitance element C1 so that the voltage on node ND2 changes from the level of precharged voltage VBL (=VCC/2) to the negative voltage level of $-$VCC/2(in the case of maximum change). Control signal /$\phi$S2 is held at power supply voltage VCC level, and control signal $\phi$S3 is held at the negative voltage level of $-$VCC/2. The charges transmitted onto node ND2 via coupling capacitance element C1 are transmitted onto sense drive line SALb via MOS transistor QN3, and the voltage level on sense drive line SALb lowers from precharged voltage VBL (=VCC/2) to the negative voltage level of $-$VCC/2. When the voltage level on sense drive line SALb lowers, the N-sense amplifier, which is formed of cross-coupled MOS transistors NT1 and NT2, is activated in sense amplifier SA, and differentially amplifies voltages on bit lines BL and /BL.

The voltage level on sense drive line SALb is substantially equal to $-$VCC/2, and the gate-source voltages and drain-source voltages of MOS transistors NT1 and NT2 are substantially equal to the voltage level of power supply voltage VCC. These MOS transistors NT1 and NT2 perform the sense operation with large driving powers. Since the voltage level on bit line BL is lower than the voltage level on bit line /BL, bit line BL is discharged via MOS transistor NT1, and the voltage level on bit line BL lowers. During this discharging operation, the gate-source voltage of MOS transistor NT1 is substantially equal to power supply voltage VCC, and the discharging via MOS transistor NT1 is performed fast. The voltage on bit line BL lowers in accordance with a ratio between a total capacitance value $\Sigma$Cb of the bit lines, which are simultaneously charged and discharged, and a capacitance value of coupling capacitance element C1.

At time t4, sense control signal /$\phi$SP is activated to turn on sense drive transistor QP2, so that the voltage level on sense drive line SALa rises to power supply voltage VCC level, and p-channel MOS transistors PT1 and PT2 perform the bit line pull-up operation. MOS transistors PT1 and PT2 raise the voltage level on bit line /BL from the level of intermediate voltage of VCC/2 to power supply voltage VCC level corresponding to the H-level data.

If the capacitance value of coupling capacitance element C1 is much larger than the bit line total capacitance value $\Sigma$Cb, sense drive line SALb is substantially held at the negative voltage level of $-$VCC/2. Therefore, the voltage level on bit line BL lowers toward the voltage level of negative voltage of $-$VCC/2. However, when the voltage level on bit line BL lowers to the negative voltage level lower than ground voltage GND, the voltage on bit line BL is transmitted to the capacitance element included in memory cell MC, and the voltage applied between the electrodes of this memory cell capacitor exceeds VCC/2, and the electric field applied across the capacitor insulating film increases so that insulating characteristics may be deteriorated. For preventing the voltage on bit line BL from lowering to or below the ground voltage, sense control signal $\phi$S2 is set to the voltage level of negative voltage of VCC/2 at time t5, to turn MOS transistor QN3 off to isolate node ND2 from sense drive line SALb for stopping supply of charges from coupling capacitance element C1.

In this state, charges transmitted from the discharged bit line slowly raise the voltage level on sense drive line SALb. For preventing instability of the voltage level on sense drive line SALb, sense control signal $\phi$S3 is raised from the negative voltage level of $-$VCC/2 to power supply voltage VCC level at time t6, to turn MOS transistor QN2 on. Responsively, sense drive line SALb is held at the ground voltage level, and the voltage level on bit line BL is held at the ground voltage level. Thereby, sense drive line SALb which was electrically floated at time t5 is fixed to ground voltage GND level at time t6, and the voltage level of L-level data stored in memory cell MC attains the stable ground voltage level.

In sense amplifier SA, activation of the N-sense amplifier (MOS transistors NT1 and NT2) is performed at time t3. When this activation produces a voltage difference between bit lines BL and /BL, the P-sense amplifier (MOS transistors PT1 and PT2) is activated at time t4. Positive feedback of the voltage change on bit lines is realized in sense amplifier SA in the operation of differentially amplifying the voltages on bit lines BL and /BL, and therefore sense amplifier SA operates fast. Sense amplifier SA is directly coupled to bit lines BL and /BL. Accordingly, when the sense operation of sense amplifier SA is completed, storage data is restored into memory cell MC, and a time dedicated to restoring is not necessary.

At time t6, column select circuit 5 shown in FIG. 1 performs the column selection, and data is written into or read from memory cell MC.

When the memory cycle is completed, word line WL in the selected state is driven to the deselected state at time t7. Then, the respective control signals return to the standby state in a predetermined sequence. The deactivation of sense control signal φS1 may be performed when the memory cycle is completed, or may be performed after node ND2 is isolated from sense drive line SALb in response to activation of control signal /φS2. Thus, sense control signal φS1 may be deactivated at an appropriate timing after time t5.

Bit line equalize instructing signal φEQ is likewise driven to the negative voltage level of −VCC/2 when deactivated. This is performed in view of the possibility that one of bit lines BL and /BL at a lower potential is driven to the negative voltage. However, bit line equalize instructing signal φEQ may be adapted to change between power supply voltage VCC and ground voltage GND.

Negative bias voltage VBB is applied to the back gates of MOS transistors QN2, QN3 and NT3–NT5, to prevent a possible flow of an unnecessary current between the back gates of MOS transistors QN2, QN3 and NT3–NT5 and sense drive line SALb when sense drive line SALb is driven to the negative voltage level. The conditions for preventing such current flow can be expressed by the following formula:

$$|VBB|>|VN2|-VB,$$

where VN2 represents a voltage on node ND2, and VB represents a contact potential (about 0.7 V) at a PN junction (between impurity region and back gate) of each MOS transistor.

It is not particularly required to apply negative bias voltage VBB to the back gate of MOS transistor NT4. However, negative bias voltage VBB is applied to the back gate of MOS transistor NT4 so that MOS transistors NT4 and NT5 can have equal threshold voltages and equal electric characteristics.

The reason why bias voltage VBB is applied to the back gates of MOS transistors NT1 and NT2 in sense amplifier SA is as follows. The back gates of MOS transistors NT1 and NT2 may be connected to sources (sense drive line SALb) as depicted by dotted line in FIG. 2. In this case, however, sense drive line SALb is connected to parasitic capacitance of the back gates of MOS transistors NT1 and NT2 included in sense amplifier SA so that the parasitic capacitance of sense drive line SALb increases, and the speed of voltage change lowers. Further, such a back gate bias modulation effect does not occur that, when the voltage on sense drive line SALb attains the negative voltage level, the voltage between the back gate and the source in each of MOS transistors NT1 and NT2 lowers in absolute value, and therefore the threshold voltages of MOS transistors NT1 and NT2 lower to increase the operation speed of the sense amplifier. Accordingly, each of MOS transistors NT1 and NT2 in sense amplifier SA is not configured to equalize voltages at the back gate and the source, and the back gate is supplied with back gate bias voltage VBB.

The voltage level on sense drive line SALb can be driven to the voltage level of −VCC/2 by setting the capacitance value of coupling capacitance element C1 to be sufficiently larger than total capacitance ΣCb of the bit lines to be operated simultaneously. This is achieved by the conditions of, e.g., C1=10·ΣCb.

Figure 4:
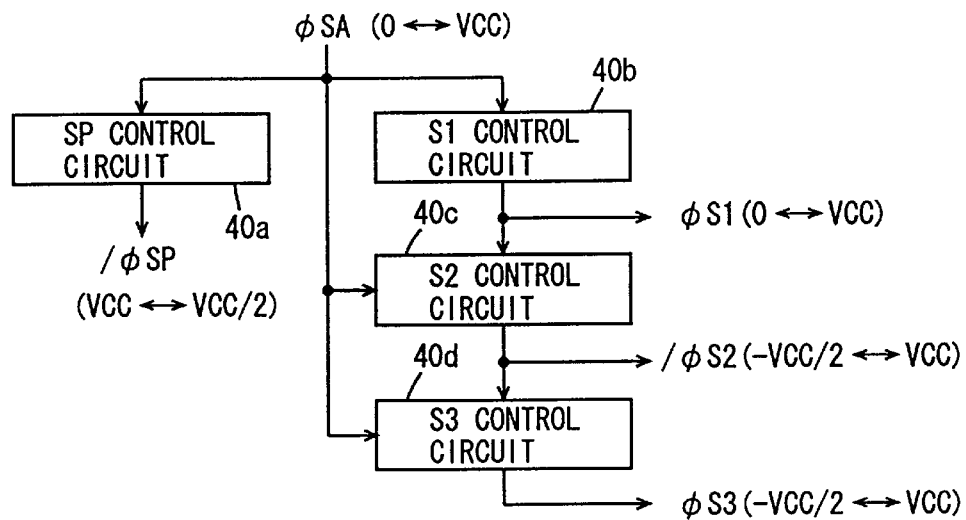
FIG. 4 schematically shows a structure of a portion for generating control signals in the structure shown in FIG. 2.

FIG. 4 schematically shows a structure of a portion for generating a sense drive control signals shown in FIG. 2. The circuit for generating the sense control signals is included in sense drive control circuit 4 shown in FIG. 2. In FIG. 4, the sense drive signal generating portion includes an SP control circuit 40a which generates sense control signal /φSP in response to sense activating signal (sense operation instructing signal) φSA, an S1 control circuit 40b which generates sense control signal φS1 in response to sense activating signal φSA, an S2 control circuit 40c which generates a sense control signal /φS2 in accordance with output signal φS1 of S1 control circuit 40b and sense activating signal φSA, and an S3 control circuit 40d which generates a sense control signal φS3 in accordance with output signal /φS2 of S2 control circuit 40c and sense activating signal φSA.

Sense activating signal φSA changes between the ground voltage (0 V) and power supply voltage VCC. Sense control signal /φSP changes between power supply voltage VCC and intermediate voltage of VCC/2. Sense control signal φS1 changes between the ground voltage (0 V) and power supply voltage VCC. Sense control signals /φS2 and φS3 change between power supply voltage VCC and negative voltage of −VCC/2. Thus, each of SP, S2 and S3 control circuits 40a, 40c and 40d has a level converting function.

S2 control circuit 40c is responsive to activation of sense control signal S1 for driving sense control signal /φS2 to negative voltage level of −VCC/2 after elapsing of a predetermined time. S3 control circuit 40d drives sense control signal φS3 to the negative voltage level in response to transition of sense control signal /φS2 to the negative voltage level. S2 and S3 control circuits 40c and 40d drive their respective output signals /φS2 and +S3 to predetermined standby states (VCC and −VCC2) when sense activating signal φSA is driven to the inactive state.

Figure 5:
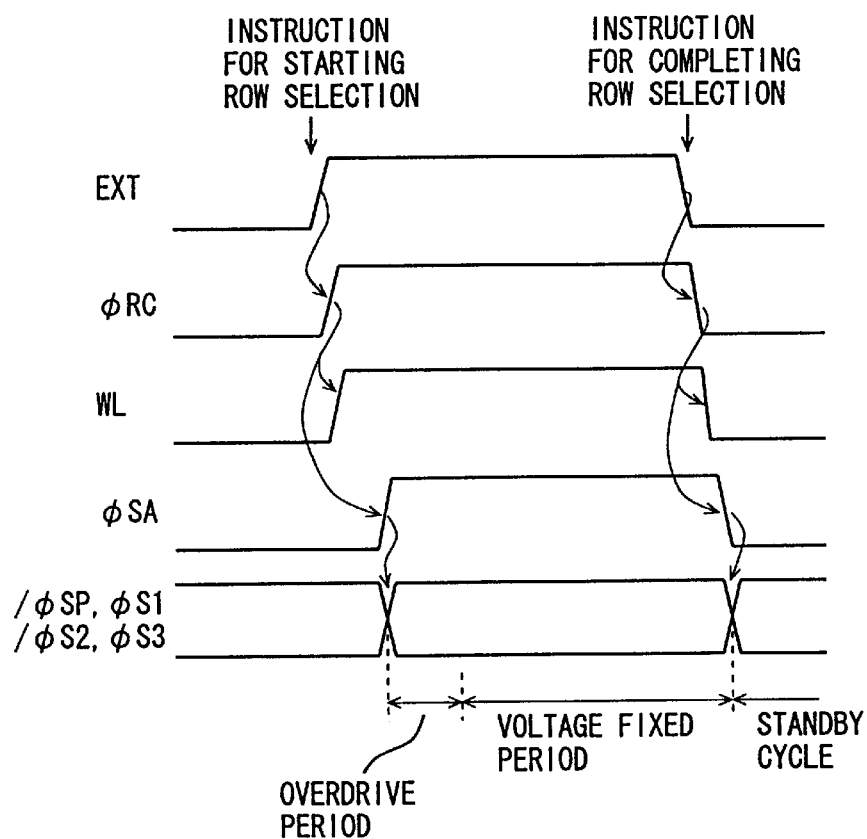
FIG. 5 is a signal waveform diagram representing operations of the structure shown in FIG. 4.

Now, operations of the sense drive signal generating portion shown in FIG. 4 will be described with reference to a signal waveform diagram of FIG. 5. FIG. 5 also shows external control signal EXT and row select control signal φRC shown in FIG. 2.

When external control signal EXT instructs start of row selecting operation, row selection instructing signal φRC from main control circuit 6 shown in FIG. 1 is driven to the active state (H-level in FIG. 5). In response to activation of row selection instructing signal φRC, the row select circuit operates, and the voltage level on a selected word line rises. When row selection instructing signal φRC is activated, sense activating signal φSA is activated at a predetermined timing, and responsively sense control signals /φSP, φS1, /φS2 and φS3 change at predetermined timings (see FIG. 3). In response to the activation of sense activating signal φSA, the sense drive line is overdriven for a predetermined period, i.e., overdrive period. When this overdrive period elapses, the voltage on sense drive line is fixed. This state is held until external signal EXT instructs completion of the row selection.

When external signal EXT instructs completion of the row selection, row selection instructing signal φRC is deactivated so that the voltage level on the selected word line WL lowers to attain the unselected state. Then, sense activating signal φSA is deactivated, and sense control signals /φSP, φS1, /φS2 and φS3 are driven to the predetermined states (standby state). Thereby, the semiconductor memory device enters the standby cycle.

In FIG. 2, driver 14 in sense drive control circuit 4 is formed of a CMOS inverter, and sense control signal φS1 is driven from L-level to H-level. However, driver 14 may be formed of a logic gate such as an NAND or NOR gate, in which case the logical level of sense control signal φS1 is appropriately adjusted depending on the structure of driver 14.

A structure of the portion for generating bit line equalize instructing signal φEQ is not shown. Bit line equalize instructing signal φEQ changes in accordance with row selection instructing signal φRC.

According to the embodiment 1 of the invention, as described above, the sense operation is performed with the sense amplifier connected to the bit line pair, and the sense drive line is overdriven upon starting the sense operation. Therefore, the sense operation can be performed fast even with a low power supply voltage. Also, a dedicated restoring time is not required so that the memory cycle can be reduced in time period.

Embodiment 2

For sufficiently overdriving sense drive line SALb, coupling capacitance element C1 must have a sufficiently large capacitance value, e.g., of 10·ΣCb. Now, consider formation of the coupling capacitance element according to a general method of using the gate capacitance of MOS transistor. If DRAM has a storage capacity of 64 Mbits, the number of bit line pairs activated (sensed) simultaneously is 16 K in accordance with the specification of refresh cycle number (4 K cycles). Since each bit line has a parasitic capacitance Cb (Cb a, Cbb) of about 0.2 pF, total capacitance ΣCb is equal to {(0.2 pF)×16 K}=3.2 nF. Assuming that a capacitor having a capacitance value ten times larger than the above total capacitance is formed of a capacitance having the same structure as the gate of the MOS transistor, the capacitor occupies the following area.

A general 64-Mbit DRAM has a gate insulating film of about 100 Å in thickness. The gate insulating film has a dielectric constant ε of about $3.6 \cdot 10^{-10}$. The coupling capacitance element C1 occupies an area of about 9.0 mm². 64-Mbit DRAM chip occupies an area of about 100 mm², and coupling capacitance element C1 occupies about 9% of the chip area.

When a capacitance having the same structure as the structure of a memory cell capacitor which will be described in detail below is employed, the coupling capacitance element occupies an area represented as follows. A unit cell in the 64-Mbit DRAM occupies an area of about 1 μm², and the memory cell capacitance has a capacitance value of about 25 fF. Therefore, the capacitance element having the capacitance value of 3.2 nF occupies an area of (3.2 nF)/(25 fF)~1.3 mm². Accordingly, the coupling capacitance element using the memory cell capacitor occupies the area of only about ⅐ of the area occupied by the capacitance element of the MOS transistor structure, and the area rate to the chip area is only about 1.3%, which is substantially at a permissible order. As the storage capacity of the memory increases in the future, the difference in occupied area increases, and the use of the capacitance element having the same structure as the memory cell capacitor becomes more advantageous. In this embodiment, the above capacitance element of a small area and a large capacitance, i.e., the capacitance element having an excellent area efficiency is utilized as a boost capacitance element (coupling capacitance element). Thereby, it is possible to provide a DRAM which has a small chip size and can implement fast operation with a low power supply voltage.

In the above description, the capacitance value of the coupling capacitance element is ten times larger than the total capacitance value of the bit lines, but is not restricted to this value. For reducing the area occupied by coupling capacitance element C1, C1 may be equal to ΣCb. In this case, the charges supplied onto sense drive line SALb are consumed by the bit line parasitic capacitance (one bit line in each bit line pair is discharged). After sensing operation starts with the sense drive line at the negative voltage level, the voltage level on the sense drive line rises, so that the operation speed of the sense amplifier may lower immediately after the sensing. Accordingly, it is desired to make the capacitance value of coupling capacitance element C1 as large as possible. The structure of the coupling capacitance element will now be described.

[Memory Cell Structure]

Figure 6:
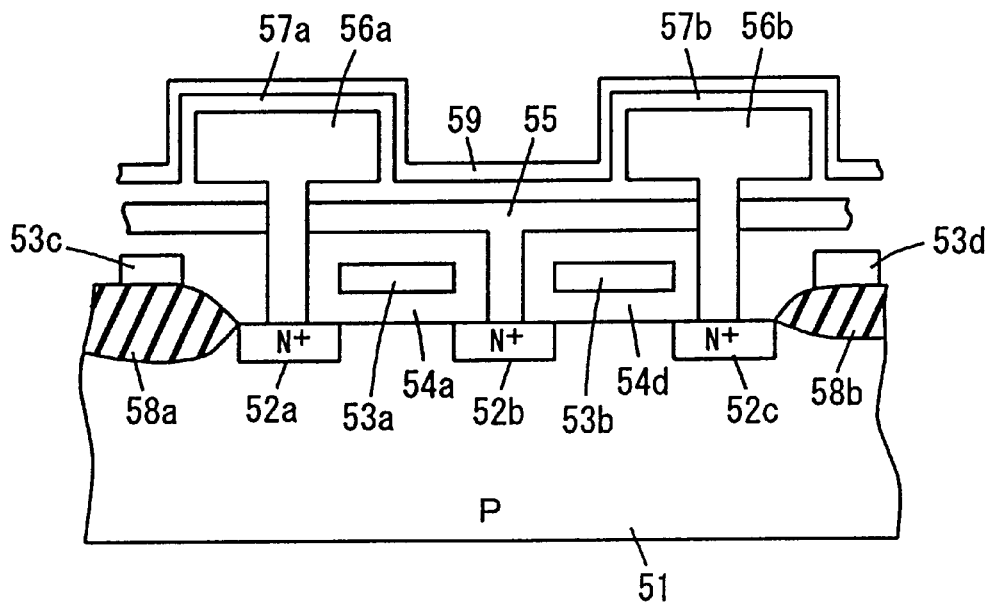
FIG. 6 schematically shows a cross sectional structure of memory cells shown in FIG. 1.

In the DRAM which is one dynamic semiconductor memory devices utilizing the invention, the memory cell has a memory cell capacitor of a stacked capacitor structure. This stacked capacitor may employ any one of fin-type, cylindrical and T-shaped structures. Also, an electrode layer forming a storage node may have a surface provided with spherical concaves and convexes. FIG. 6 shows, as a typical example, a structure of a memory cell having a T-shaped stacked capacitor.

In FIG. 6, a P-type semiconductor substrate 51 is provided at its surface with a plurality of (three) heavily doped N-type impurity regions 52a, 52b and 52c spaced apart from each other. Semiconductor substrate region 51 may be a semiconductor substrate itself, or may be an epitaxial layer or a well region. Semiconductor substrate region 51 is merely required to serve as a substrate for the memory cell.

A gate electrode layer (word line) 53a having a predetermined pattern is arranged on the surface of semiconductor substrate region 51 between impurity regions 52a and 52b with a gate insulating film 54a underlaid. A gate electrode layer (word line) 53b is arranged on semiconductor substrate region 51 between impurity regions 52a and 52c with gate insulating film 54b underlaid. Gate electrode layers 53a and 53b may be made of impurity doped polycrystalline silicon having a low resistance. Alternatively, each of gate electrode layers 53a and 53b may have a composite structure of a low resistance formed of a refractory metal such as tungsten or molybdenum, and polycrystalline silicon, or may have a low-resistance refractory metal silicide structure. The memory cells are arranged in a matrix of rows and columns as already described, and gate electrode layers 53 and 53b are arranged corresponding to the rows of the memory cells, and are connected to the memory cells in the corresponding rows, respectively.

A conductive layer 56a forming a storage node of the memory cell capacitor is arranged for impurity region 52a, and a conductive layer 56b, which is of a T-shape in cross section and also serves as a storage node, is arranged for impurity region 52c. Conductive layers 56a and 56b forming the storage nodes are made of a low resistance, impurity-doped polycrystalline silicon. Conductive layers 56a and 56b are electrically connected to corresponding impurity regions 52a and 52c and each have a rectangular shape in cross section having a relatively large height at an upper portion thereof for increasing an area facing to a cell plate described later. The "electrically connection" between a layer and a region means the connection through which electrical signals can be transmitted. The electrical connection can be made between a layer and a region, between which another interconnection layer (e.g., barrier layer) is present, and can also can be made via a switching transistor.

A conductive layer 55 forming the bit line is electrically connected to impurity region 52b. Conductive layer 55 depicted in the figure is arranged above gate electrode layers 53a and 53b and below the upper portions of the storage nodes. However, conductive layer 55 forming the bit line may be arranged above the storage node and the cell plate.

Conductive layer 55 forming the bit line may have either a composite structure formed of a refractory metal such as tungsten and polycrystalline silicon, or a refractory metal silicide structure. Conductive layers 55 each extend in the column direction of memory cells, and are arranged correspondingly to the columns, respectively. Each conductive layer 55 is connected to the memory cells in the corresponding column.

Element isolating films (thermal oxide films) 58a and 58b, formed of, e.g., LOCOS (Local Oxidation of Silicon) films are arranged adjacent to impurity regions 52a and 52c for isolation from neighboring memory cells. Gate electrode layers (word lines) 53c and 53d provided corresponding to the memory cells in adjacent rows are arranged on element isolating films 58a and 58b, respectively.

A conductive layer 59 forming the cells plate is arranged over conductive layers 56a and 56b forming storage nodes with insulating films 57a and 57b underlaid. Conductive layer 59 forming the cell plate is formed of an impurity-doped polycrystalline silicon of a low resistance. Each of capacitor insulating films 57a and 57b has a double-layer structure formed of a silicon nitride film and a silicon oxide film, and has a large dielectric constant to increase the effective film thickness of the capacitor insulating film.

In the structure shown in FIG. 6, one memory cell is formed of impurity regions 52a and 52b, gate electrode layer 53a, conductive layer 56a forming the storage node, insulating film 57a and conductive layer 59 forming the cell plate. Another memory cell is formed of impurity regions 52b and 52c, gate electrode layer 53b, conductive layer 56b, insulating film 57b and conductive layer 59. Adjacent memory cells share one impurity region 52b, whereby an area occupied by the memory cells is reduced.

As can be seen from the structure shown in FIG. 6, the memory cell capacitor overlaps with the memory cell transistor, i.e., access transistor in a plan view. This three-dimensional cell structure reduces the area occupied by the cells. Each of conductive layers 56a and 56b forming the storage node has the upper portion having a relatively large thickness, and faces to conductive layer 59 forming the cell plate with a large area, to increase the facing area between the capacitor electrodes, to increase the capacitance value of the memory cell capacitor without increasing the area occupied by a cell capacitor in the plan view. As described above, the stacked capacitor structure implement the capacitor of an excellent area efficiency. The embodiment 2 employs the structure of this memory cell capacitor.

[Structure 1 of Coupling Capacitance Element]

Figure 7:
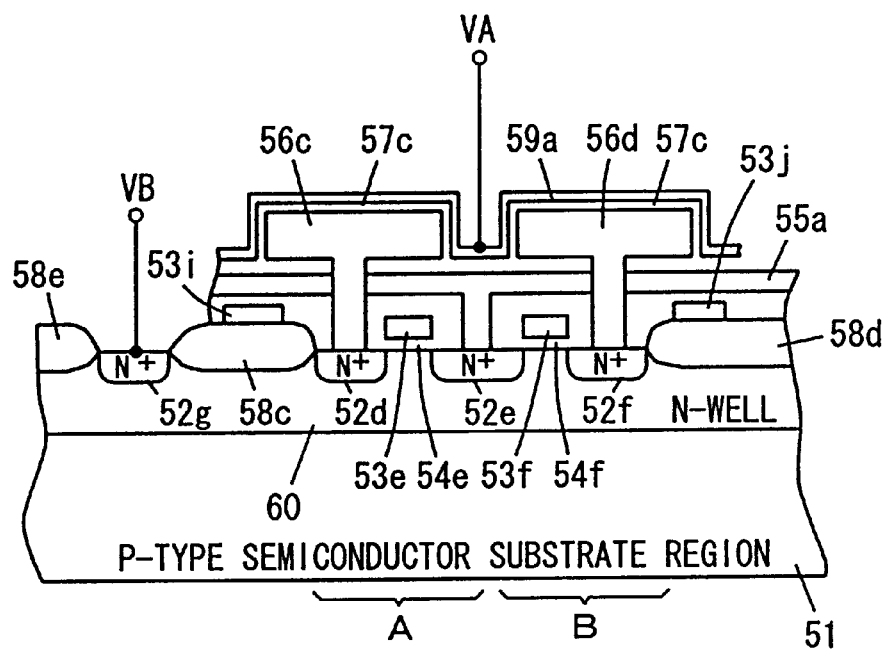
FIG. 7 schematically shows a sectional structure of a coupling capacitance element according to an embodiment 2 of the invention.

FIG. 7 schematically shows a structure of the coupling capacitance element according to the embodiment 2 of the invention. In FIG. 7, an N-well (N-type semiconductor layer) 60 is formed at the surface of P-type semiconductor substrate region 51. N-well region 60 serves as a substrate region of capacitance elements having the same structures as the memory cells shown in FIG. 6. More specifically, heavily doped impurity regions 52d–52g spaced apart from each other are formed at the surface of N-well region 60. Impurity regions 52d–52g are formed in the same manufacturing steps as impurity regions 52a–52c shown in FIG. 6, and have the same impurity concentration. In the following description, components in FIG. 7 which bear the same reference numerals as those in FIG. 6 except suffixes are formed by the same steps.

An element isolating film 58d such as a thermal oxide film (LOCOS film) for element isolation is arranged adjacent to impurity region 52f. An element isolating film 58c is formed between impurity regions 52d and 52g. An element isolating film 58e is in contact with an outer portion of impurity region 52g. Element isolating films 58e and 58d define regions for forming the capacitance elements.

A gate electrode layer (conductive layer) 53e is formed on semiconductor substrate region (N-well) 60 between impurity regions 52d and 52e with a gate insulating film 54e underlaid. A conductive layer 53f is formed on the surface of semiconductor substrate region 60 between impurity regions 52e and 52f with a gate insulating film 54f underlaid. Conductive layers 53i and 53j are formed on element isolating films 58c and 58d, respectively. These conductive layers 53e, 53f, 53i and 53j are formed of a material similar to that of gate electrode layers 53a and 53b shown in FIG. 6 (i.e., an impurity-doped, low resistance polycrystalline silicon, a refractory metal or a refractory metal silicide), and are formed at the same interconnection layer. Conductive layers 53e, 53f, 53i and 53j each correspond to the word lines.

First conductive layers 56c and 56d each having a T-shape in cross section are formed for impurity regions 52d and 52f, and are electrically connected thereto, respectively. Each of first conductive layers 56c and 56d has a plug portion (leg portion) for electrical connection to corresponding impurity region 52d or 52f, and a flat portion having a relatively large surface area and forming an actual capacitance. First conductive layers 56c and 56d are formed in the same manufacturing steps as conductive layers 56a and 56b forming the storage nodes of memory cells shown in FIG. 6, and the material (impurity-doped polycrystalline silicon), structure and level of conductive layers 56a and 56b are the same as those of first conductive layers 56c and 56d. First conductive layers 56c and 56d have a predetermined pattern, and are isolated from each other by an interlayer insulating film. A second conductive layer 59a, which is formed of polycrystalline silicon heavily doped with impurity and having a low resistance, is formed on and facing to first conductive layers 56c and 56d with an insulating film 57c underlaid. Second conductive layer 59a is formed in the same manufacturing steps as the cell plate electrode layer, is formed at the same layer, and is electrically connected to one electrode node VA. An impurity region 52g formed at semiconductor substrate region 60 is connected to other electrode node VB.

Impurity region 52e is electrically connected to a third conductive layer 55a extending horizontally in the figure. Third conductive layer 55a corresponds to conductive layer 55 forming the bit line of the memory cell shown in FIG. 6, is formed in the same manufacturing steps, is made of the same material (e.g., refractory metal silicide) as conductive layer 55 corresponding to the bit line, and is formed at the same interconnection layer as conductive layer 55.

In the structure shown in FIG. 7, second conductive layer 59a forms one electrode. First conductive layers 56c and 56d are electrically connected to N-well (semiconductor substrate region) 60 via impurity regions 52g and 52f, respectively, and are further electrically connected to the other electrode node VB. Accordingly, the capacitances formed in regions A and B are connected in parallel between electrode nodes VA and VB. Electrode nodes VA and VB are connected to nodes ND1 and ND2 shown in FIG. 2, respectively. Node ND2 is precharged to intermediate voltage of VCC2. In this state, the voltage on node ND1 is at power supply voltage VCC level. When the voltage on node ND1 lowers to the ground voltage level, the voltage on node ND2 is lowered to the voltage level of −VCC/2 by capacitive coupling. The voltage applied between these nodes ND1 and ND2 is equal to intermediate voltage of VCC2. Even with the coupling capacitance element formed of the capacitance element having the same structure as the memory cell capacitance, the maximum voltage applied across capacitor insulating film 57c is equal to VCC2, so that dielectric breakdown of the capacitor insulating film is prevented. Thus, it is possible to implement the coupling capacitance element which occupies a small area and has a large capacitance value.

The capacitance element shown in FIG. 7 has the same structure as the memory cell, and the capacitance elements formed on regions A and B occupy a sufficiently small area. Capacitor insulating film 57c has a double-layer structure formed of a silicon nitride film and a silicon oxide film, similarly to capacitor insulating films 57a and 57b of the memory cells, and the sufficiently large capacitance value can be achieved with a small occupying area.

The capacitance elements formed on regions A and B have the same structures as the memory cell, and therefore all the components can be formed through the same manufacturing steps as those for the corresponding components in the memory cells except for formation of semiconductor substrate region (N-well) 60, all the same in impurity concentration, interconnection layer, material and film thickness. Accordingly, the coupling capacitor element having an excellent area efficiency can be implemented without increasing the number of manufacturing steps in DRAM.

Figure 8:
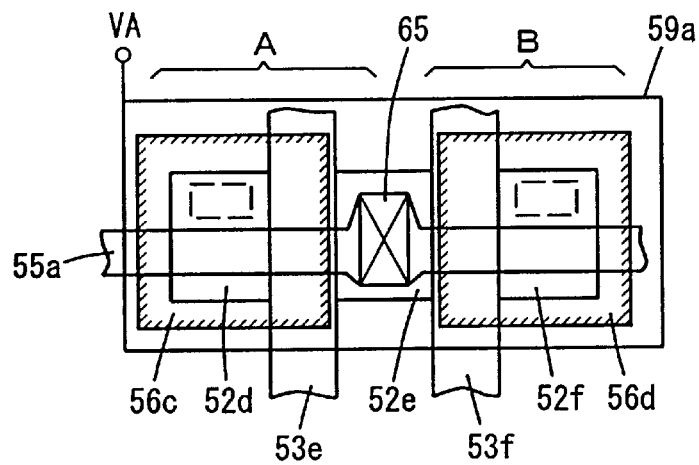
FIG. 8 schematically shows a plan layout of the coupling capacitance element shown in FIG. 7.

FIG. 8 shows a planar layout of the capacitance elements shown in FIG. 7. In FIG. 8, conductive layer 53e is arranged between impurity regions 52d and 52e, and conductive layer 53f is arranged between impurity regions 52e and 52f. Impurity region 52e is electrically connected to conductive layer 55a corresponding to the bit line via a contact hole 65. Conductive layers 53e and 53f are arranged perpendicularly to conductive layer 55a. This is because the capacitance element has the same structure as the memory cell, conductive layers 53e and 53f correspond to word lines, and conductive layer 55a corresponds to bit line, as already described. Impurity region 52d is electrically connected to first conductive layer 56c via the plug portion depicted by dotted line, and impurity region 52f is electrically connected to first conductive layer 56d via the plug portion depicted by dotted line. Second conductive layer 59a is arranged above first conductive layers 56c and 56d. First conductive layers 56c and 56d forming the electrode nodes of capacitance elements have extended portions located above conductive layers 53e and 53f, respectively.

As shown in FIG. 7, the upper flat portion of each of first conductive layers 56c and 56d has a large film thickness, and therefore has a sufficiently large surface area. Accordingly, the facing area of second conductive layer 59a to first conductive layers 56c and 56d is sufficiently large. The required number of capacitance elements shown in FIGS. 7 and 8 are arranged in rows and columns, similarly to the array structure of the memory cells.

Figure 9A:
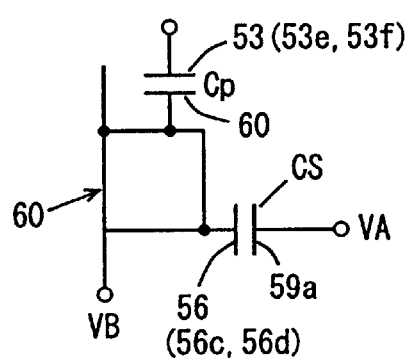
FIGS. 9A–9C schematically show electrically equivalent circuits of the coupling capacitance element shown in FIG. 7.
Figure 9B:
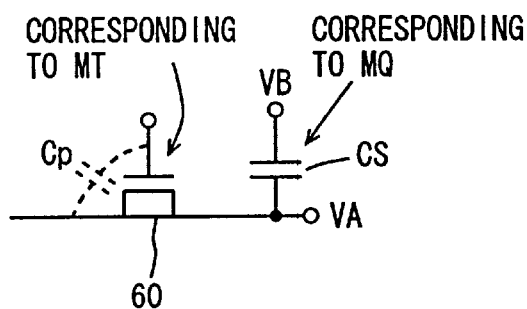
Figure 9C:
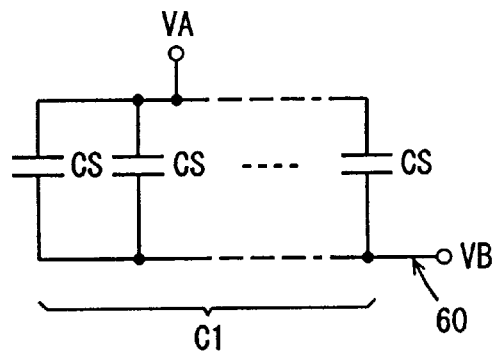

FIGS. 9A and 9B show electrically equivalent circuits of one unit capacitance element, respectively. FIG. 9C shows an electrically equivalent circuit of the coupling capacitance element according to the invention. As shown in FIG. 9A, one unit capacitance element includes a capacitance CS formed of conductive layers 59a and 56 (56c or 56d), and a capacitance Cp formed of conductive layer 53 (53e or 53f) and semiconductor substrate region (N-well) 60. Capacitances Cp and CS are connected in parallel to semiconductor substrate region 60. One electrode of capacitance CS is connected to node VA. Semiconductor substrate region 60 is connected to the other electrode node VB.

As shown in FIG. 9B, capacitance Cp is an MOS capacitor corresponding to memory cell transistor (access transistor) MT, and corresponds to the gate capacitance of access transistor MT. Capacitance Cp has a breakdown voltage larger than power supply voltage VCC, and can keep the reliability even if power supply voltage VCC is fixedly supplied to conductive layer 53. However, conductive layer 53 forming capacitance Cp may be made electrically floated. Capacitance CS corresponds to memory cell capacitor MQ. The insulating film of capacitance CS is sufficiently thin, and has the breakdown voltage equal to the intermediate voltage of VCC2. However, the maximum voltage applied between nodes VA and VB is equal to VCC2, and therefore the reliability of the insulating film of capacitance CS is not impaired.

A plurality of unit capacitance elements each having the same structure as that shown in FIG. 9A are arranged in parallel between nodes VA and VB as shown in FIG. 9C. In FIG. 9C, capacitance Cp is not shown because the capacitance value thereof is much smaller than that of capacitance CS. As shown in FIG. 9C, capacitance CS are connected in parallel between nodes VA and VB. Assuming that capacitance CS are X in number, the coupling capacitance element has the capacitance value of X·CS. Accordingly, by connecting in parallel the required number of unit capacitance elements CS, which correspond to the memory cell capacitors, respectively, the coupling capacitance element having the required capacitance value can be easily implemented with a small occupying area.

[Structure 2 of Coupling Capacitance Element]

Figure 10A:
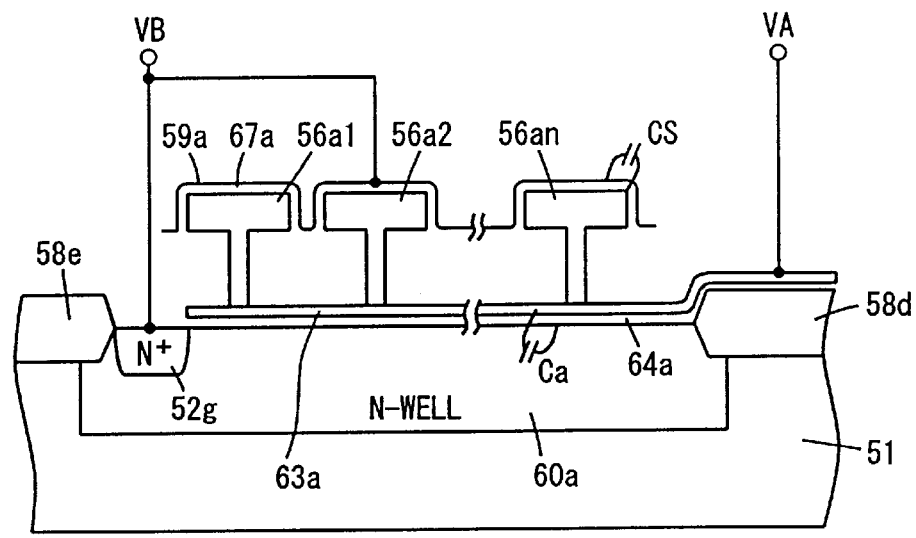
FIG. 10A shows a second structure of the coupling capacitance element according to the embodiment 2 of the invention.

FIG. 10A schematically shows another structure of the coupling capacitance element of the embodiment 2 of the invention. In FIG. 10A, N-well 60 which functions as a substrate region of the coupling capacitance element (merely referred to as the "N-well" hereinafter) is formed at the surface of P-type semiconductor substrate region 51. A periphery of N-well 60a is defined by field insulating films (element isolating films) 58e and 58d. A conductive layer 63a corresponding to a word line is formed over substantially the entire surface of N-well 60a with a gate insulating film 64a underlaid. N-well 60a is electrically connected to electrode node VB via heavily doped N-type impurity region formed at the periphery thereof. Conductive layer 63a is connected to electrode node VA. Conductive layer 63a, gate insulating film 64a and N-well 60a form a gate conventional capacitor Ca corresponding to the gate capacitance of the access transistor.

In FIG. 10A, conductive layers 56a1–56an corresponding to storage nodes are formed on conductive layer 63a. Each of conductive layers 56a1–56an has a T-shape in cross section, similarly to the storage node of memory cell. In the process of forming the memory cell capacitors, the storage nodes are formed after the gate electrode layers (word lines) of the access transistors are formed. In the process of forming the storage node, the contact hole is formed for providing a contact with the impurity region of the access transistor. In the structure shown in FIG. 10A, the contact holes for contacting conductive layers 56a1–56an corresponding to the storage nodes with conductive layer 63a can be formed by utilizing the process for forming the contact holes, through which the impurity regions for forming the capacitance elements are electrically connected to the conductive layer corresponding to a storage node shown in FIG. 7. In the process of forming the storage nodes of the memory cells, conductive layers 56a1–56an corresponding to storage nodes can also be formed simultaneously. Accordingly, it is not necessary to increase the number of masks and the number of manufacturing steps.

Conductive layer 59a corresponding to a cell plate is formed on conductive layers 56a1–56an corresponding to storage nodes with an insulating film 67a corresponding to the capacitor insulating films of memory cells underlaid. The structure that conductive layers 56a1–56an form the capacitance together with conductive layer 59a is the same as that of the structure shown in FIG. 7. Unit capacitance element CS is formed between conductive layers 56ai and 56a. Conductive layer 59a is electrically connected to electrode node VB. The term "corresponding to" means "formed in the same manufacturing process".

Figure 10B:
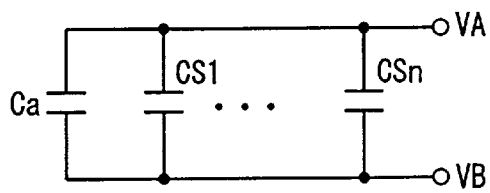
FIG. 10B shows an electrically equivalent circuit of the structure shown in FIG. 10A.

In the structure shown in FIG. 10A, capacitance element Ca and unit capacitance elements CS1–CSn are electrically connected in parallel between electrode nodes VA and VB, as can be seen from an electrically equivalent circuit diagram of FIG. 10B. The capacitance elements, which are formed of conductive layers 56a1–56an corresponding to the storage nodes as well as insulating film 67a and conductive layer 59a, are located above the MOS capacitor formed of conductive layer 63a, insulating film 64a and N-well 60a. Accordingly, the additional capacitance elements are formed hierarchically above the conventional MOS capacitor, and therefore the capacitance value of the capacitance element can be increased without increasing the area.

In the structure of the coupling capacitance element shown in FIG. 10A, the voltage equal to half the power supply voltage VCC can likewise be applied between electrode nodes VA and VB. Therefore, it is possible to implement the coupling capacitance element, which occupies a small area, and has an excellent area efficiency without impairing the breakdown voltage characteristics.

[Structure 3 of Coupling Capacitance Element]

Figure 11A:
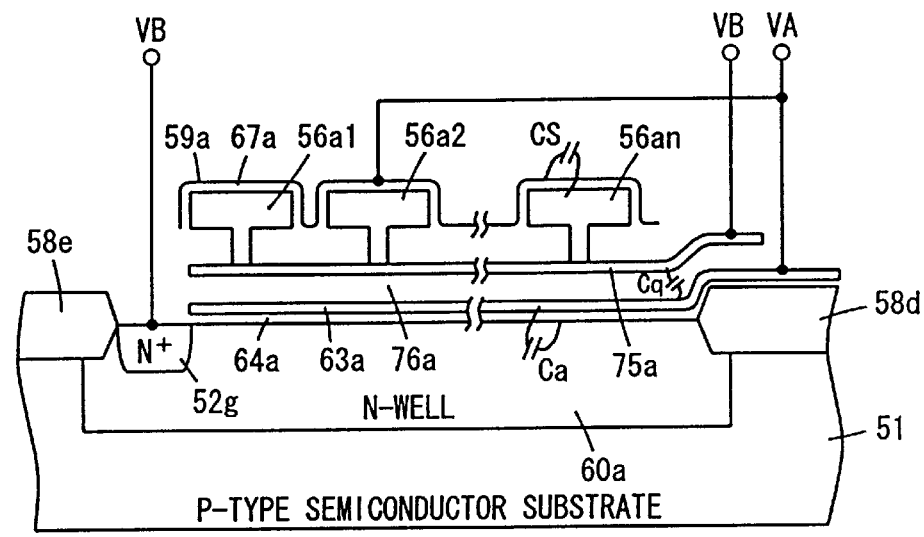
FIG. 11A schematically shows a third structure of the coupling capacitance element according to the embodiment 2 of the invention.

FIG. 11A schematically shows still another structure of the coupling capacitance element according to the embodiment 2 of the invention. In the structure shown in FIG. 11A, conductive layer 63a corresponding to a word line is formed over the surface of N-well 60a with insulating film 64a underlaid. A conductive layer 75a corresponding to a bit line is formed over a substantially whole surface of conductive layer 63a with an interlayer insulating film 76a underlaid. Conductive layers 56a1–56an corresponding to storage nodes are formed on conductive layer 75a. Conductive layers 56a1–56an are commonly connected to conductive layer 75a. The capacitance forming portion (flat top portion) of each storage node in the memory cell is located above the bit line. In the memory cell manufacturing process, the storage nodes can be formed after formation of the bit lines.

In the structure of the coupling capacitance element shown in FIG. 11A, therefore, the contact holes for electrical connection of conductive layers 56a1–56an to conductive layer 75a corresponding to a bit line can be formed in the same manufacturing process as that of manufacturing the memory cell capacitor, similarly to the formation of the contact hole for connection between the unit capacitance element and the corresponding impurity region shown in FIG. 7. Accordingly, even the structure shown in FIG. 11A does not increase the number of masks as well as the number of manufacturing processes.

N-well 60a is electrically connected to electrode node VB via impurity region 52g. Conductive layer 63a is electrically connected to electrode node VA. Conductive layer 75a is electrically connected to electrode node VB.

In the structure of the coupling capacitance element shown in FIG. 11A, a capacitance Cq is formed of conductive layer 63a corresponding to a word line, conductive layer 75a corresponding to a bit line and interlayer insulating film 76a. Conductive layers 56a1–56an corresponding to storage nodes as well as conductive layer 59a form a capacitance of the capacitance value of n CS, similarly to the structure shown in FIG. 10A. Even with conductive layer 75a formed, the capacitance value of the capacitance formed of conductive layers 56a1–56an and conductive layer 59a proportionate to the surface areas of the flat top portions of conductive layers 56a1–56an. Therefore, the capacitance value of the capacitance formed of conductive layer 59a, conductive layers 56a1–56an and insulating film 67a is equal to the capacitance value of the coupling capacitance element shown in FIG. 10A.

Figure 11B:
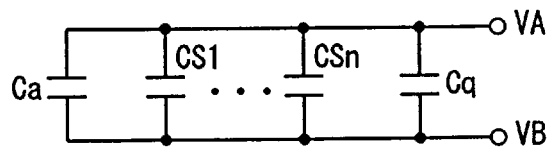
FIG. 11B shows an electrically equivalent circuit of the structure shown in FIG. 11A.

In the structure of the coupling capacitance element shown in FIG. 11A, capacitance Ca, CS1, . . . CSn and Cq are connected in parallel between electrode nodes VA and VB as shown in an electrically equivalent circuit diagram of FIG. 11B. Therefore, the capacitance value of the capacitance element can be larger by the capacitance value of capacitance element Cq formed of conductive layer 75a, interlayer insulating film 76 and conductive layer 63a, than that of the capacitance element shown in FIG. 10A. Interlayer insulating film 76a is larger in film thickness by about twenty times than gate insulating film 54a, in order to prevent capacitive coupling due to a parasitic capacitance between interconnection lines. Accordingly, the capacitance value of capacitance Cq is equal to about 5% of the capacitance value of capacitance Ca, and the capacitance value of the coupling capacitance element shown in FIG. 11A can increase by about 5% of the capacitance value of the coupling capacitance element shown in FIG. 10A.

Conductive layer 75a corresponding to a bit line may have a composite structure made of a refractory metal (e.g., tungsten or molybdenum) and polycrystalline silicon, or a refractory metal silicide structure. This holds also for conductive layer 63a corresponding to a word line.

In the structures shown in FIGS. 10A and 11A, a P-type impurity region adjacent to N-type impurity region 52g may be formed at the surface of N-well 60a, to be electrically connected to electrode node VB for forming an inversion layer. In this case, a MOS capacitor is formed instead of the gate capacitance.

As described above, the embodiment 2 of the invention utilizes, in the coupling capacitance element, the capacitance element having the same structure as the capacitor of the memory cell, and therefore can provide the coupling capacitance element occupying a small area and having a large capacitance value and therefore a high area utilizing efficiency, without increasing the number of manufacturing steps.

Embodiment 3

Figure 12:
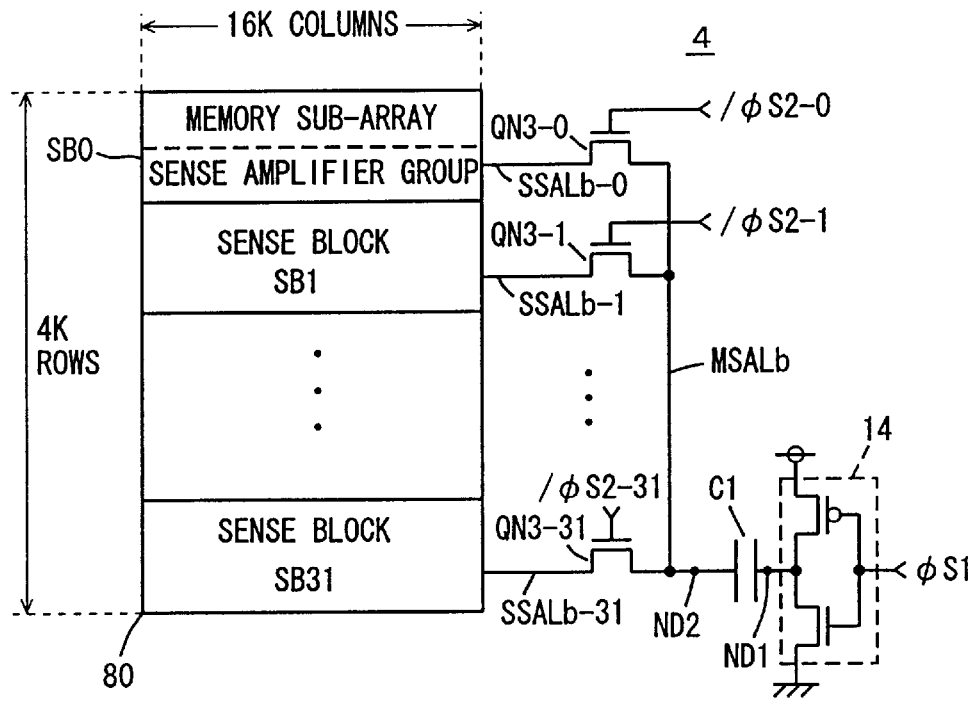
FIG. 12 schematically shows a structure of a main portion of a semiconductor memory device according to an embodiment 3 of the invention.

FIG. 12 schematically shows a structure of a main portion of a DRAM according to an embodiment 3 of the invention. The DRAM shown in FIG. 12 has a storage capacity of 64 Mbits, and a memory array 80 has memory cells arranged in 4K rows and 16K columns. In the structure, the 4K row configuration is employed under the assumption that the refresh cycle is 4K cycles, and each row is refreshed once in one refresh cycle. Therefore, the arrangement of memory cells in 4K rows and 16K columns in memory cell array 80 represents the logical arrangement of the memory cells.

Memory array 80 is divided into 32 sense blocks SB0–SB31. Each of sense blocks SB0–SB31 includes a memory sub-array including memory cells arranged in rows and columns, and a sense amplifier group. The sense amplifier group includes sense amplifiers arranged corresponding to the respective columns of memory cells in a corresponding memory sub-array. According to this structure wherein memory array 80 is divided into a plurality of memory sub-array array, and the sense amplifier group is provided for each memory sub-array, the length of the bit lines in the memory sub-array can be made short so that the bit line capacitance can be reduced, and a read voltage of the memory cell can be secured. In a normal operation mode, one of sense blocks SB0–SB31 is driven to a selected state (i.e., a word line in a memory sub-array is selected).

A sense drive control circuit 4 includes n-channel charge-supplying MOS transistors QN3-0–QN3-31 provided corresponding to sense blocks SB0–SB31, respectively, a coupling capacitance element C1 is commonly connected to MOS transistors QN3-0–QN3-31 via a sense main drive line MSALb, and a driver 14 for driving coupling capacitance element C1 in accordance with sense control signal φS1.

MOS transistors QN3-0–QN3-31 receive sense control signals /φS2-0–/φS2-31 on their gates, respectively. Only the block sense control signal provided for a sense block to be selected is driven to the selected state. Thereby, the selected sense block is supplied with charges (negative charges) via corresponding MOS transistor QN3-i (i=1, 2, ... or 31) from sub-sense drive line SSALb-i provided for the corresponding sense amplifier group.

In operation, one of sub-sense drive lines SSALb-0–SSALb-31 provided corresponding to the respective sense blocks SB0–SB31 is coupled to main sense drive line MSALb. Accordingly, coupling capacitance element C1 is provided commonly for sense blocks SB0–SB31, whereby the area occupied by the sense drive control circuit is reduced.

The operations of driver 14 and coupling capacitance element C1 are the same as that of sense drive control circuit 4 in the embodiment 1 already described. When driver 14 changes the voltage level on node ND1, this voltage change is transmitted onto node ND2, and the charges are supplied to the sub-sense drive line corresponding to the selected sense block.

Figure 13A:
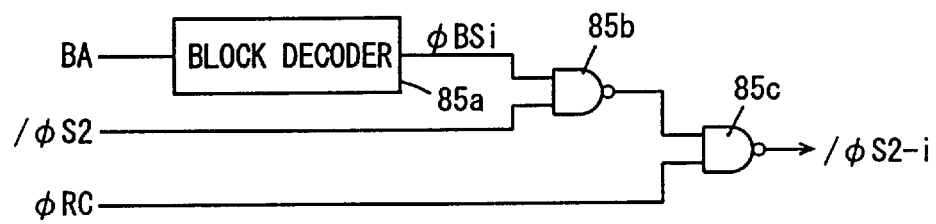
FIG. 13A schematically shows a structure of a portion for generating control signals shown in FIG. 12.
Figure 13B:
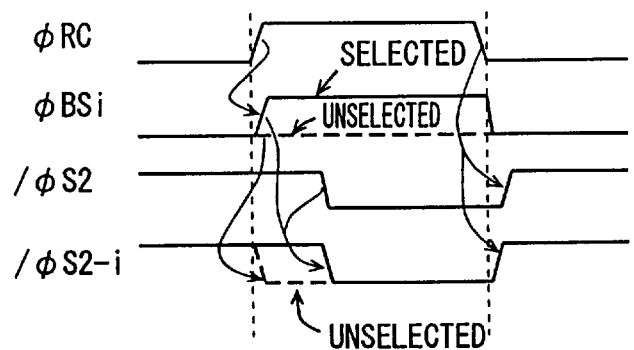
FIG. 13B is a signal waveform diagram representing operations of the structure shown in FIG. 13A.

FIG. 13A schematically shows a structure of a portion for generating sense control signal /φS2-i. In FIG. 13A, the sense control signal generating portion includes a block decoder 85a for decoding a block address signal BA specifying a sense block to generate a sense block specifying signal φBSi, an NAND circuit 85b receiving sense block specifying signal φBSi from block decoder 85a as well as sense control signal /φS2, and an NAND circuit 85c receiving the output signal of NAND circuit 85b and row selection instructing signal φRC, to activate block sense control signal /φS2-i. As shown in FIG. 5, row selection instructing signal φRC is driven to the active state at H-level when the row selection start instruction is applied, while driven to the inactive state at L-level when an instruction for completing row selection is applied. Block decoder 85a drives sense block specifying signal φBSi for the sense block specified by block address signal BA to the active state (H-level). Now, the operation of sense control signal generating portion shown in FIG. 13A will now be described with reference to a signal waveform diagram of FIG. 13B.

When row selection instructing signal φRC becomes active, block decoder 85a is activated to decode block address signal BA to drive sense block specifying signal φBSi for the addressed sense block to the active state. In the standby cycle, row selection instructing signal φRC is at L-level, and sense control signal /φS2-i is at H-level. In the standby state, therefore, sub-sense drive lines SSALb-0–SSALb-31 shown in FIG. 12 are all coupled to main sense drive line MSALb, and are precharged to the intermediate voltage.

When the instruction for starting the row selection is applied, sense block specifying signal φBSi from block decoder 85a attains H-level, and NAND circuit 85b operates as an inverter. Further, row selection instructing signal φRC is at H-level, and NAND circuit 85c operates as an inverter. For the selected sense block, block sense control signal /φS2-i is produced in accordance with sense control signal /φS2. For an unselected sense block, sense block specifying signal φBSi maintains L-level. Therefore, the output signal of NAND circuit 85b attains H-level, and block sense control signal φS2-i from NAND circuit 85c attains L-level. Accordingly, the sub-sense drive line provided corresponding to the unselected sense block is isolated from main sense drive line MSALb. Thereby, only the selected sense block can be supplied with charges from coupling capacitance element.

When the row selecting operation is completed, and one memory cycle is completed, row selection instructing signal φRC attains L-level, and sense control signal /φS2-i rises to H-level, so that sub-sense drive lines SSALb-0–SSALb-31 are coupled to main sense drive line MSALb.

Although not clearly shown in FIG. 12, n-channel MOS transistor QN2 for fixing to the ground voltage shown in FIG. 2 is provided for each of sub-sense drive lines SSALb-0–SSALb-31. MOS transistor QN2 for fixing to the ground potential can be controlled by a structure similar to that of the control signal generating portion shown in FIG. 13A (for grounding the selected block, and for electrically floating unselected blocks).

As shown in FIG. 2, control of sense drive transistor (QP2) for sub-sense drive line SSALa provided for P-sense amplifier included in the sense amplifier group is performed on a sense block basis. In this case, sense control signal /φSPi for the selected sense block is activated in accordance with the combination of the sense block specifying signal from the block decoder and sense control signal /φSP.

[Modification 1]

Figure 14:
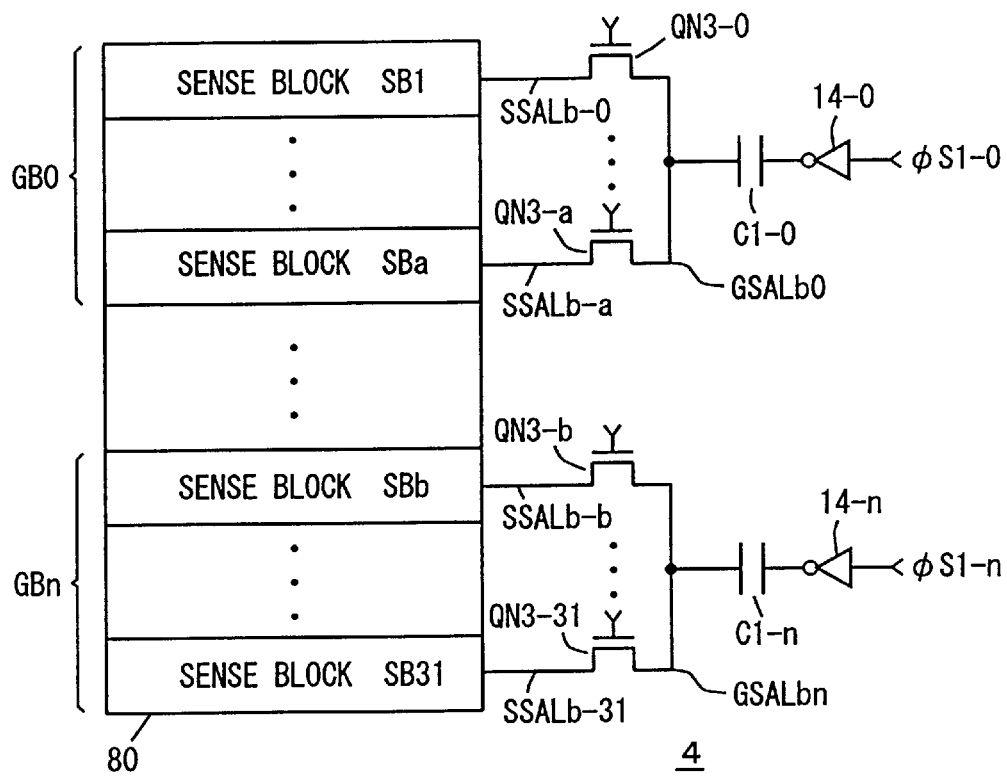
FIG. 14 schematically shows a structure of a first modification of the embodiment 3 of the invention.

FIG. 14 schematically shows a structure of a modification 1 of the embodiment 3 of the invention. In FIG. 14, sense blocks SB0–SB31 included in memory array 80 are grouped into a plurality of global sense blocks GB0–GBn. In an example shown in FIG. 14, global sense block GB0 includes sense blocks SB0–SBa, and global sense block GBn includes sense blocks SBb–SB31. Global sense drive lines GSALb0–GSALbn are arranged for these global sense blocks GB0–GBn, respectively. Each of global sense drive lines GSALb0–GSALbn is coupled to the sub-sense drive lines for the sense blocks included in the corresponding global sense block via MOS transistors QN3. For example, global sense drive line GSALb0 is coupled to sub-sense drive lines SSALb-0–SSALLb-a provided for sense blocks SB0–SBa via MOS transistors QN3-0–QN3-a, respectively. Global sense drive line GSALbn is connected to sub-sense drive lines SSALb-b–SSALb-31 provided for sense blocks SBb–SB31 via MOS transistors QN3-b–QN3-31, respectively.

Coupling capacitance elements C1-0–C1-n are provided for global sense drive lines GSALb0–GSALbn, respectively, and drivers 14-0–14-n receiving sense control signals φS1-0–φS1-n are provided corresponding to coupling capacitance elements C1-0–C1-n, respectively.

Among MOS transistors QN3-0–QN3-31, only the transistor provided for a selected sense block is turned on in the sense operation, and the others are held in the off state, similarly to the structure shown in FIG. 12. Sense control signal φS1-j for driver 14-j provided for global sense block GBj including the selected sense block is activated. In the structure shown in FIG. 14, therefore, each of global sense drive lines GSALb0–GSALbn is short in length, so that the charges can be transmitted fast onto a sense drive line provided for a selected sense block without a delay due to interconnection line resistance and interconnection line capacitance, and the sense operation can be performed fast.

Figure 15:
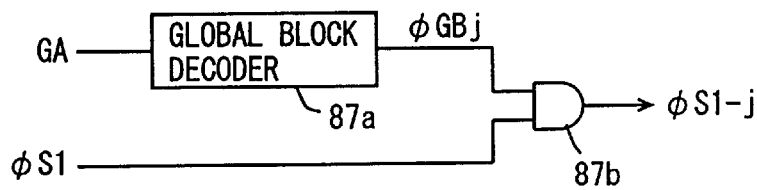
FIG. 15 schematically shows a structure of a portion for generating control signals shown in FIG. 14.

FIG. 15 schematically shows a structure of a portion for generating sense control signal φS1-j. In FIG. 15, the sense control signal generating portion includes a global block decoder 87a for decoding a global address signal GA specifying a global block to produce a global block specifying signal φGBj, and an AND circuit 87b receiving global block specifying signal φGBj and sense control signal φS1, to produce sense control signal φS1-j. Global block address signal GA is formed of predetermined address bits in the row address signal. When global sense block GBj includes a selected sense block, corresponding global block specifying signal φGBj is driven to the active state (H-level). Therefore, only sense control signal φS1-1 for the selected sense global block changes in accordance with sense control signal φS1. For the unselected sense global blocks, sense control signal φS1-j maintains the inactive state at L-level.

Global sense block specifying signal φGBj may be applied to NAND circuit 85c shown in FIG. 13A. In this structure, connection between the sub-sense drive line and the global sense drive line is controlled only in the selected global sense block. In the unselected global sense blocks, sub-sense drive lines SSALb are always connected to corresponding global sense drive lines GSALb. In this case, however, precharging and equalizing of the sense drive lines are performed on a sense block basis.

In the structures shown in FIGS. 12 and 14, memory array 80 may be divided into blocks of any number other than 32. The sense blocks included in each of global sense blocks GB0–GBn may be 4, 8 or 16 in number, and the number thereof can be determined in accordance with the interconnection line delay on the global sense drive line.

[Modification 2]

Figure 16:
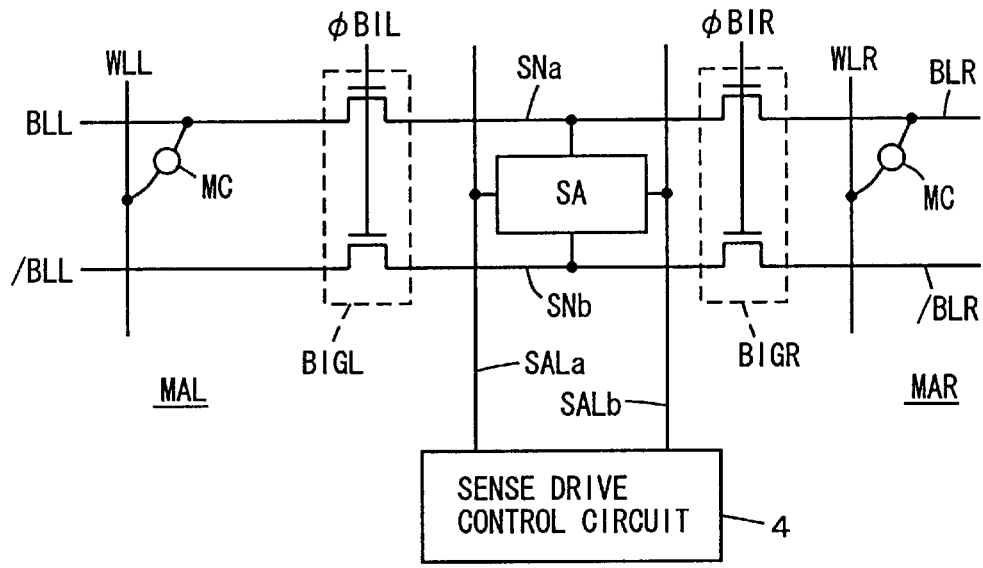
FIG. 16 schematically shows a structure of a modification 2 of the embodiment 3 of the invention.

FIG. 16 shows a structure of a modification 2 of the embodiment 3 of the invention. FIG. 16 schematically shows a structure related to one column in each of memory sub-blocks MAL and MAR. In memory subblock MAL, bit lines BLL and /BLL are coupled to sense nodes SNa and SNb via bit line isolating gate BIGL, respectively. Bit lines BLR and /BLR in memory sub-block MAR are coupled to sense nodes SNa and SNb via bit line isolating gate BIGR, respectively. Sense amplifier SA differentially amplifies the voltages on sense nodes SNa and SNb. Bit lines BLL and /BLL are connected to memory cells in one column, and bit lines BLR and /BLR are also connected to memory cells in one column. FIG. 16 representatively shows memory cells MC arranged corresponding to the crossing between word line WLL and bit line BLL and the crossing between bit line BLR and word line WLR.

Sense amplifier SA is activated in accordance with the signal voltages on sense drive lines SALa and SALb driven by sense drive control circuit 4, to differentially amplify the voltages on sense nodes SNa and SNb. Sense drive control circuit 4 may have either the structure shown in FIG. 12 or that shown in FIG. 14.

The structure shown in FIG. 16 is a so-called "shared sense amplifier structure". In this shared sense amplifier structure, sense drive lines SALa and SALb are overdriven in the sense operation so that the sense operation can be performed fast, similarly to the foregoing structures.

Bit line isolating gates BIGL and BIGR are selectively turned on and off in accordance with bit line isolation instructing signals φBIL and φBIR, respectively. When one of memory sub-blocks MAL and MAR includes a selected memory cell, the bit line isolating gate for this selected memory sub-block maintains the on state, and the bit line isolating gate provided for the unselected memory sub-block is turned off. Sense amplifier SA is coupled to the bit line pair of only one of the memory sub-blocks, so that the sense operation can be performed fast similarly to the embodiments already described.

Bit line isolation instructing signals φBIL and φBIR change between high voltage Vpp and ground voltage GND. When bit line isolating gates BIGL and BIGR are on, they are in a low resistance state, and exert no influence on the sense operation of sense amplifier SA. In the shared sense amplifier structure shown in FIG. 16, sense drive control circuit 4 can overdrive the sense drive line in the sense operation, so that fast sensing can be implemented even with a low power supply voltage.

Figure 17A:
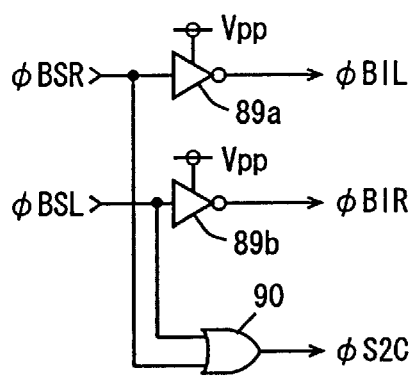
FIG. 17A schematically shows a structure of a portion for generating control signals shown in FIG. 16.

FIG. 17A schematically shows a structure of a portion for generating a bit line isolation instructing signal. In FIG. 17A, the portion for generating the bit line isolation instructing signal includes an inverter circuit 89a with a level converting function for inverting memory sub-block specifying signal φBSR to produce bit line isolation instructing signal φBIL, and an inverter circuit 89b with a level converting function for inverting memory sub-block specifying signal φBSL to produce bit line isolation instructing signal φBIR. Inverter circuits 89a and 89b receive high voltage Vpp higher than the power supply voltage as one operation voltage, and set the H-levels of bit line isolation instructing signals φBIL and φBIR to high voltage Vpp level, respectively. Memory sub-block specifying signals φBSR and φBSL specify memory sub-blocks MAR and MAL, respectively, and attain H-level (power supply voltage level) in the selected state.

Figure 17B:
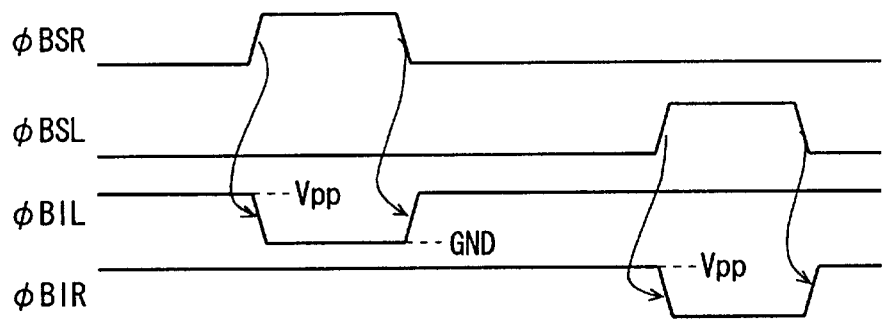
FIG. 17B is a signal waveform diagram representing operations of the structure shown in FIG. 17A.

An OR circuit 90 ORes memory sub-block specifying signals φBSR and φBSL to produce a control signal φS2C for controlling sense control signal φS2. When one of memory sub-blocks MAL and MAR is selected (i.e., includes a selected memory cell), sense drive control circuit 4 activates sense amplifier SA. When both memory sub-blocks MAL and MAR are in the unselected (include no selected memory cell), sense amplifier SA maintains the inactive state. The operation of the portion for generating the bit line isolation instructing signal shown in FIG. 17A will now be described with reference to a signal waveform diagram of FIG. 17B.

In a standby cycle, memory sub-block specifying signals φBSR and φBSL are both at L-level, and memory sub-blocks MAL and MAR are in the unselected state. In this state, inverter circuits 89a and 89b set bit line isolation instructing signals φBIL and φBIR respectively to high voltage Vpp level. Therefore, bit line isolating gates BIGL and BIGR shown in FIG. 16 are both in the on state, so that bit lines BLL and BLR are coupled to sense node SNa, and bit lines /BLL and /BLR are coupled to sense node SNb. In this state, the precharge/equalize circuit (not shown) precharges and equalizes the bit lines BLL, /BLL, BLR and /BLR as well as sense nodes SNa and SNb to the intermediate voltage level.

When a memory cycle starts and memory sub-block MAR includes a selected memory cell, memory sub-block specifying signal φBSR rises to H-level, and responsively bit line isolation instructing signal φBIL lowers to the ground voltage level. In this state, bit line isolating gate BIGL shown in FIG. 16 is turned off, and bit lines BLL and /BLL are isolated from sense nodes SNa and SNb, respectively. Other bit line isolating gate BIGR maintains the on state because bit line isolation instructing signal φBIR is at high voltage Vpp level. In this state, sense amplifier SA is activated by control signal φS2C from OR circuit 90, to sense and amplify the memory cell data on bit lines BLR and /BLR of memory sub-block MAR.

When memory sub-block MAL is selected, memory sub-block specifying signal φBSL rises to H-level, and responsively bit line isolation instructing signal φBIR falls to the ground voltage level. In this state, bit line isolating gate BIGR is turned off, and isolates bit lines BLR and /BLR from sense amplifier SA. Other bit line isolating gate BIGL is kept on, and sense amplifier SA is coupled to bit lines BLL and /BLL. Sense amplifier SA is activated to sense and amplify the memory cell data in response to control signal φS2C from OR circuit 90 after word line WLL is selected.

By utilizing the portion for generating the control signal shown in FIG. 17A, it is possible to activate only the sense amplifier group provided for a selected memory sub-block.

The shared sense amplifier structure may be a "an alternately arranged shared sense amplifier structure", in which sense amplifiers are arranged alternately on the opposite sides in the column direction of the memory sub-blocks. With the alternate arrangement type structure, a similar effect can be provided.

According to the embodiment 3 of the invention, as described above, the memory array is divided into a plurality of memory sub-blocks, the coupling capacitance element and the driver are provided for each group of a predetermined number of sub-blocks, and only the sense drive line for a selected memory sub-block is supplied with charges from the coupling capacitance element. Therefore, it is possible to implement the sense amplifier circuit allowing fast operation with a low power consumption.

Embodiment 4

Figure 18:
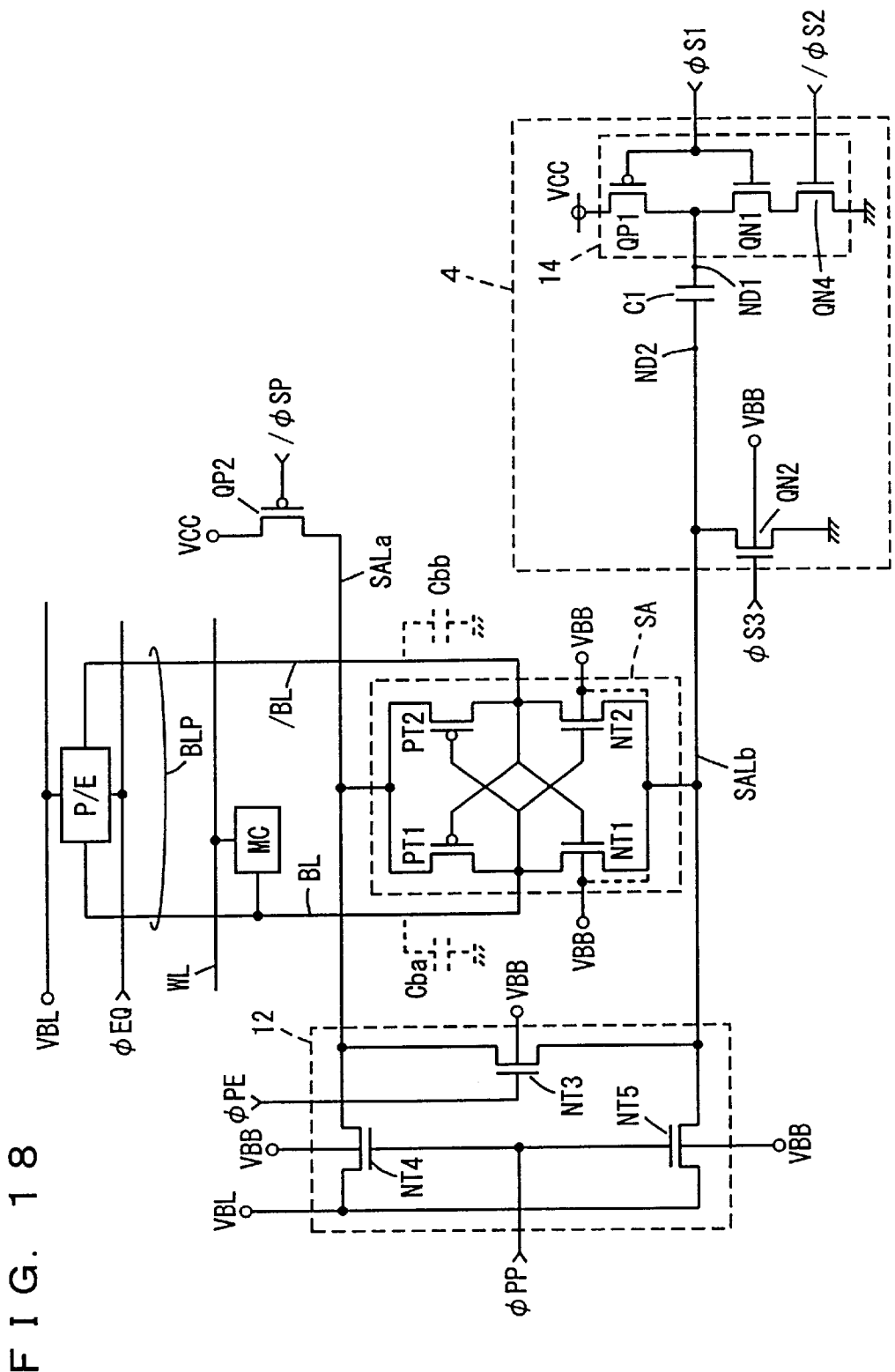
FIG. 18 shows a structure according to an embodiment 4 of the invention.

FIG. 18 schematically shows a structure of an embodiment 4 of the invention. The structure shown in FIG. 18 differs from sense drive control circuit 4 in the structure shown in FIG. 2 in the following point. In the structure shown in FIG. 18, charges supplied from coupling capacitance element C1 are directly supplied onto sense drive line SALb via node ND2. In the structure in FIG. 18, n-channel MOS transistor QN3 for isolating node ND2 from sense drive line SALb is not provided.

Driver 14 includes MOS transistors QP1 and QN1 which receive sense control signal φS1 on their gates, and an n-channel MOS transistor QN4 which is connected between MOS transistor QN1 and the ground node and has a gate receiving sense control signal /φS2. MOS transistor QN4 provides the function similar to that of MOS transistor QN3 for isolation shown in FIG. 2. Structures other than the above are the same as those shown in FIG. 2 and corresponding portions bear the same reference numerals, and will not be described in detail.

In the structure shown in FIG. 18, when control signal φS1 rises from L-level to H-level, the voltage at node ND1 lowers from power supply voltage VCC level to the ground voltage level. Responsively, the voltage level on node ND2 lowers to the negative voltage level. Sense control signal /φS2 falls from H-level to L-level at a predetermined timing after the voltage level on node ND2 lowers to the negative voltage level, to turn off n-channel MOS transistor QN4. Driver 14 attains the output high-impedance state, and stops supply of charges onto node ND2 via coupling capacitance element C1. MOS transistor QN2 is turned on in accordance with sense control signal φS3 after elapsing of a predetermined time, to fix node ND2 to the ground voltage level.

Accordingly, the operation of the circuit shown in FIG. 18 is substantially the same as that represented by the signal waveform diagram of FIG. 3.

In the structure shown in FIG. 18, node ND2 is directly coupled to sense drive line SALb. Accordingly, the charges from coupling capacitance element C1 can be efficiently and rapidly transmitted onto sense drive line SALb. When precharging to the intermediate voltage is performed in the standby cycle, the charges from sense-precharge/equalize circuit 12 are directly transmitted via sense drive line SALb onto node ND2 not through a transistor element. Therefore, node ND2 can be rapidly precharged to the intermediate voltage level. When the voltage level on node ND2 rises from the ground voltage level to the intermediate voltage level, the voltage level on node ND1 does not change because driver 14 fixes node ND1 to power supply voltage VCC level.

According to the structure of the embodiment 4 of the invention, as described above, charges of the coupling capacitance element are transmitted directly onto the sense drive line. Therefore, charges can be efficiently transmitted between the electrode node of the coupling capacitance element and the sense drive line, and fast sense operation as well as fast precharge/equalize operations can be implemented.

Embodiment 5

Figure 19:
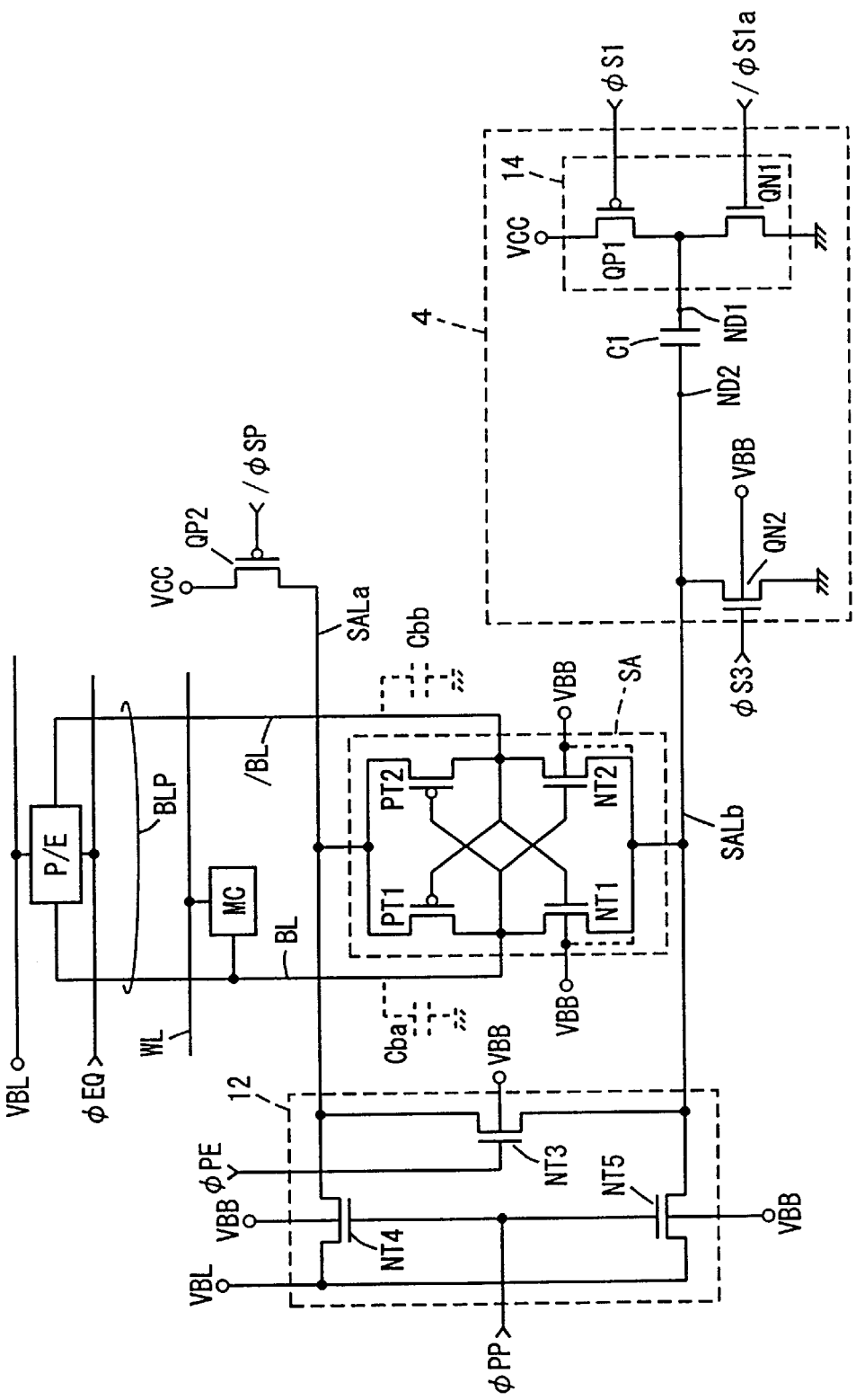
FIG. 19 shows a structure according to an embodiment 5 of the invention.

FIG. 19 shows a structure of a main portion of an embodiment 5 of the invention. The structure shown in FIG. 19 differs from the structure shown in FIG. 2 in structure of sense drive control circuit 4. In the sense drive control circuit 4 shown in FIG. 19, electrode node ND2 of coupling capacitance element C1 is directly coupled to sense drive line SALb. In driver 14, p-channel MOS transistor QP1 receives sense control signal φS1 on its gate, and n-channel MOS transistor QN1 receives sense drive control signal φS1a on its gate. Structures other than the above are the same as those shown in FIG. 2, and corresponding portions bear the same reference numerals, and will not be described in detail. Sense control signal φS1a rises substantially the same timing as sense control signal φS1, and will attain the L-level of ground voltage level after elapsing of a predetermined time. The operation of sense drive control circuit 4 shown in FIG. 19 will be described below with reference to a signal waveform diagram of FIG. 20.

At time t1, a memory cycle starts, and precharging and equalizing of bit lines BL and /BL as well as precharging and equalizing of sense drive lines SALa and SALb are completed.

Figure 20:
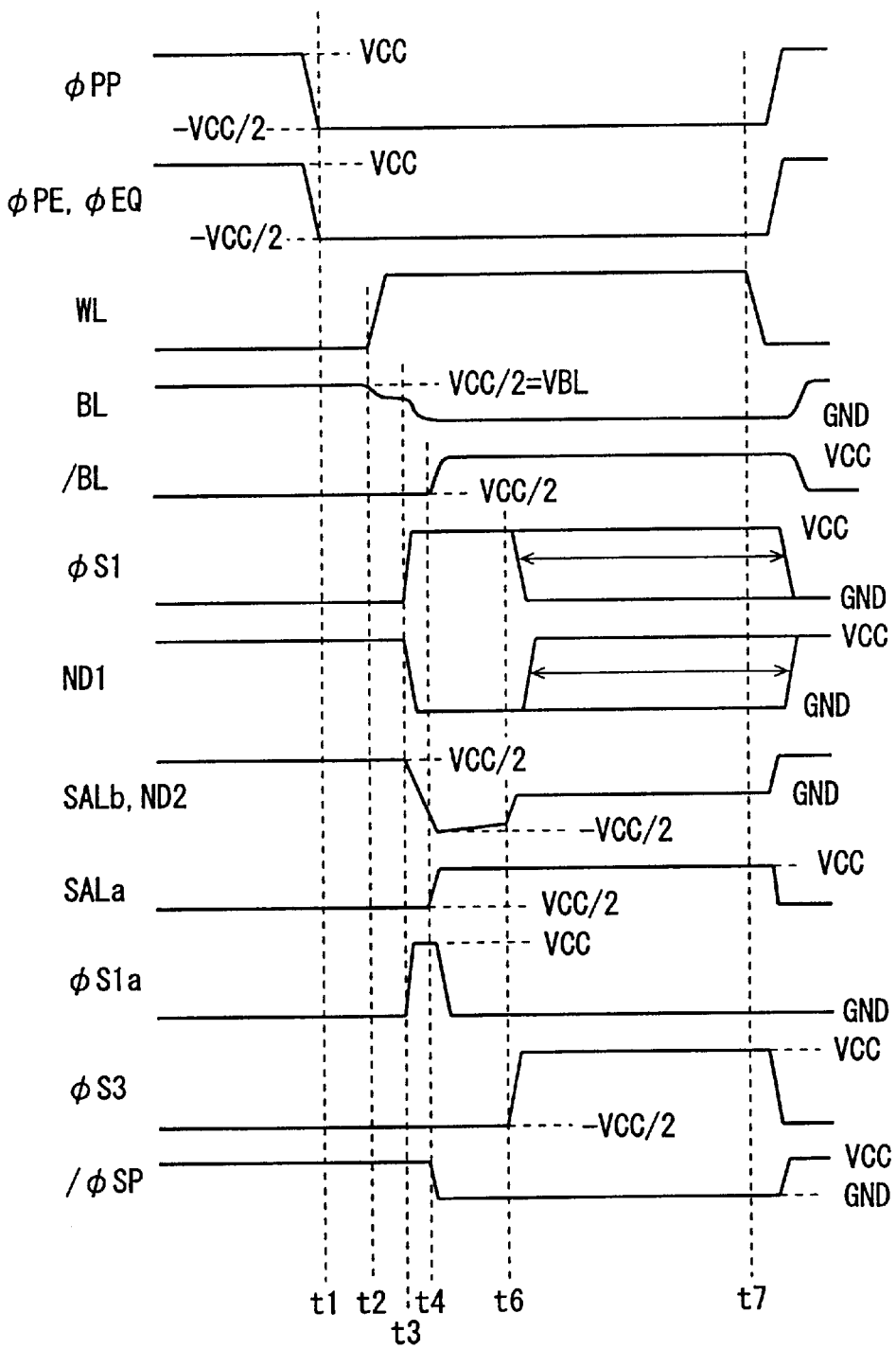
FIG. 20 is a signal waveform diagram representing operations of the structure shown in FIG. 19.

At time t2, word line WL is selected, and the voltage difference according to the storage data of memory cell MC occurs between bit lines BL and /BL. FIG. 20 shows signal waveforms in a case where data at L-level is read onto bit line BL.

When the voltage difference between bit lines BL and /BL is adequately increased, sense control signals φS1 and φS1a are driven to H-level (power supply voltage VCC level) at time t3. Responsively, MOS transistor QP1 in driver 14 is turned off, MOS transistor QN1 is turned on, and node ND1 lowers from power supply voltage VCC level to ground voltage GND level. Thereby, the voltage level on node ND2 lowers from the level of intermediate voltage of VCC/2 to the level of negative voltage of -VCC2, and, the voltage level on sense drive line SALb changes in a similar manner since node ND2 is directly coupled to sense drive line SALb. Responsively, the N-sense amplifier in sense amplifier SA is activated, and the voltage level on bit line BL further lowers.

At time t4, when the voltage level on bit line BL lowers substantially to the ground voltage level, sense control signal φS1a is driven to the ground voltage level. Responsively, driver 14 attains the output high-impedance state, and stops supply of charges onto node ND2 via coupling capacitance element C1. Sense control signal /φSP is activated, and sense drive line SALa is driven to power supply voltage VCC level corresponding to the H-level data. Responsively, the P-sense amplifier in sense amplifier SA is activated, and the voltage level on bit line /BL rises.

At time t6, sense control signal φS3 is driven to H-level and MOS transistor QN2 is turned on to drive sense drive line SALb to the ground voltage level. Thereby, bit line BL is stably supplied with ground voltage.

After time t6, sense control signal φS1 is driven to the inactive state at an appropriate timing, and the voltage level on node ND1 rises to power supply voltage VCC level. In this state, charges supplied from coupling capacitance element C1 are discharged via MOS transistor QN2. At time t7, the memory cycle is completed.

In the structure shown in FIG. 19, MOS transistor QN1 in driver 14 is turned on only for a period until the voltage level on bit line (BL) at a lower voltage reaches the ground voltage level. Therefore, charges (negative charges) can be supplied via coupling capacitance element C1 only during a required period. Since node ND2 is directly coupled to sense drive line SALb, charges can be efficiently supplied to sense drive line SALb, and fast sense operation can be achieved.

In driver 14, control signal φS1a controls on/off of MOS transistor QN1, and the voltage level on node ND1 is rapidly driven to the ground voltage level in a required period. Thereby, the voltage on node DN1 can change rapidly, and the voltage level on sense drive line SALb can change rapidly so that the fast sense operation can be achieved.

In the signal waveform diagram of FIG. 20, sense control signal φS1 is deactivated at an appropriate timing after time t6. However, sense control signal φS1 may be driven to the inactive state at or after time t7 when the memory cycle is completed.

Figure 21:
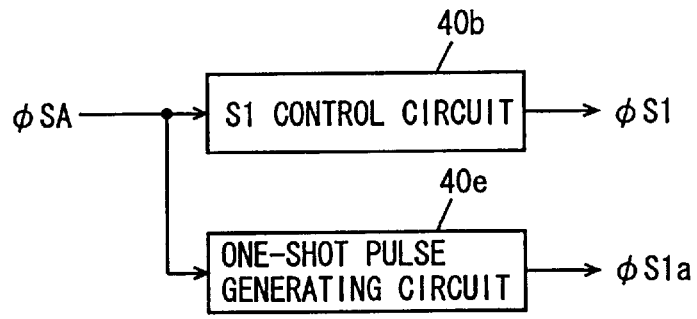
FIG. 21 schematically shows a structure of a portion for generating control signals shown in FIG. 19.

FIG. 21 schematically shows a structure of a portion for generating the sense control signal. In FIG. 21, the sense control signal generating portion includes S1 control circuit 40b which generates sense control signal φS1 in response to sense activating signal φSA, and a one-shot pulse generating circuit 40e which generates a one-shot pulse in response to activation of sense activating signal φSA. One-shot pulse generating circuit 40e produces sense control signal φS1a. The structure of sense control signal generating portion shown in FIG. 21 corresponds to the structure of sense control signal generating portion shown in FIG. 4. By utilizing the structure shown in FIG. 21, sense control signal φS1a can rise to H-level (i.e., is activated) substantially at the same timing as sense control signal φS1, to maintain this active state for a predetermined period.

According to the embodiment 5 of the invention, as described above, the coupling capacitance element is directly coupled to the sense drive line, and the respective transistors of the driver of the CMOS inverter type driving the coupling capacitance element receive different control signals. Therefore, the output node of the driver can be charged and discharged fast, so that the sense drive line can be driven fast via the coupling capacitance element, and the fast sense operation can be achieved.

[Embodiment 6]

Figure 22:
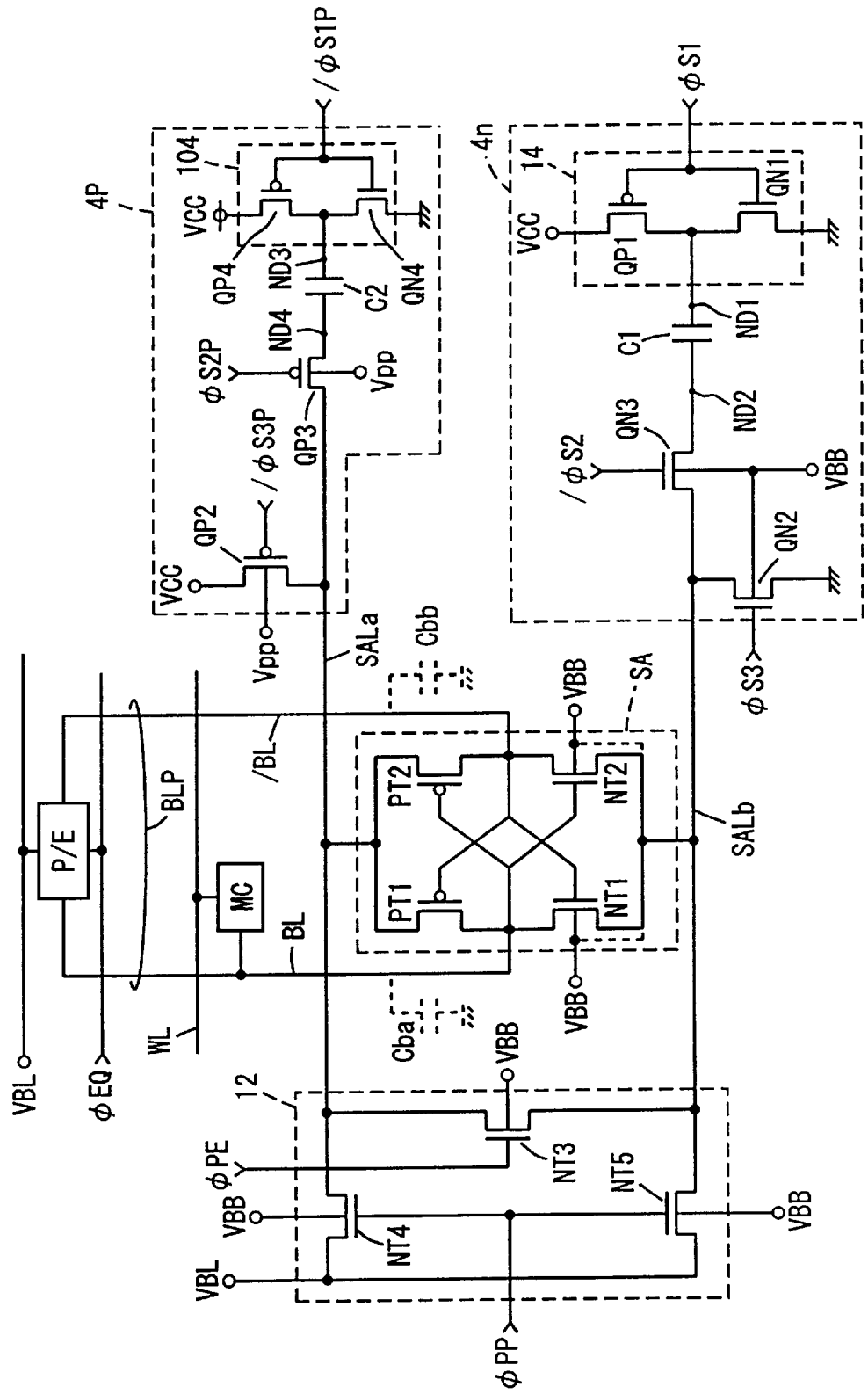
FIG. 22 shows a structure according to an embodiment 6 of the invention.

FIG. 22 shows a structure of a main portion of a semiconductor memory device according to an embodiment 6 of the invention. In FIG. 22, sense drive line SALa is provided with a P-sense drive control circuit 4p, and sense drive line SALb is provided with an N-sense drive control circuit 4n. Sense drive control circuit 4n has the same structure as sense drive control circuit 4 shown in FIG. 2, and overdrives sense drive line SALb when N-sense amplifier (MOS transistors NT1 and NT2) included in sense amplifier SA is made active.

P-sense drive control circuit 4p includes a driver 104 for driving a node ND3 in accordance with a sense control signal /φS1P, a coupling capacitance element C2 for transmitting the output signal of driver 104 onto node ND4 by capacitance coupling, a p-channel MOS transistor QP3 for coupling node ND4 to sense drive line SALa in accordance with a sense control signal φS2P, and a p-channel MOS transistor QP2 for electrically connecting sense drive line SALa to the power supply node in accordance with a sense control signal /φS3P.

Driver 104 is formed of a CMOS inverter including of p- and n-channel MOS transistors QP4 and QN4. MOS transistors PQ2 and PQ3 are supplied on their back gates with high voltage Vpp higher than power supply voltage VCC, or at the voltage level of 3·VCC2. As the operation will be described later, when sense drive line SALa is overdriven to raise its voltage level to 3·VCC2, the PN junction formed between the impurity regions and the back gates of MOS transistors QP2 and QP3 may become conductive, which the high voltage level of 3·VCC/2 (VPP>3·VCC/2−VB) is employed for preventing.

Other bit line peripheral circuits have the same structures as those shown in FIG. 2 and corresponding portions bear the same reference numerals, and will not be described in detail. The operation of sense drive control circuit shown in FIG. 22 will be described below with reference to FIG. 23.

The operation of N-sense drive control circuit 4n is the same as that represented in the signal waveform diagram of FIG. 3, and the operation of P-sense drive control circuit 4p will be described below.

In a standby cycle before time ta, precharge instructing signal φPP and equalize instructing signals φEQ and φPE are at power supply voltage VCC level, and bit line precharge/equalize circuit P/E as well as sense precharge/equalize circuit 12 are active, and bit lines BL and /BL as well as sense chive lines SALa and SALb are at the precharged voltage level of intermediate voltage of VCC2.

When a memory cycle starts at time ta, bit line precharge/equalize instructing signal φEQ lowers to the ground voltage level, and sense precharge instructing signal φPP and sense equalize instructing signal φPE lower to the level of negative voltage of −VCC2. Thereby, the precharge/equalize operation is completed.

Figure 23:
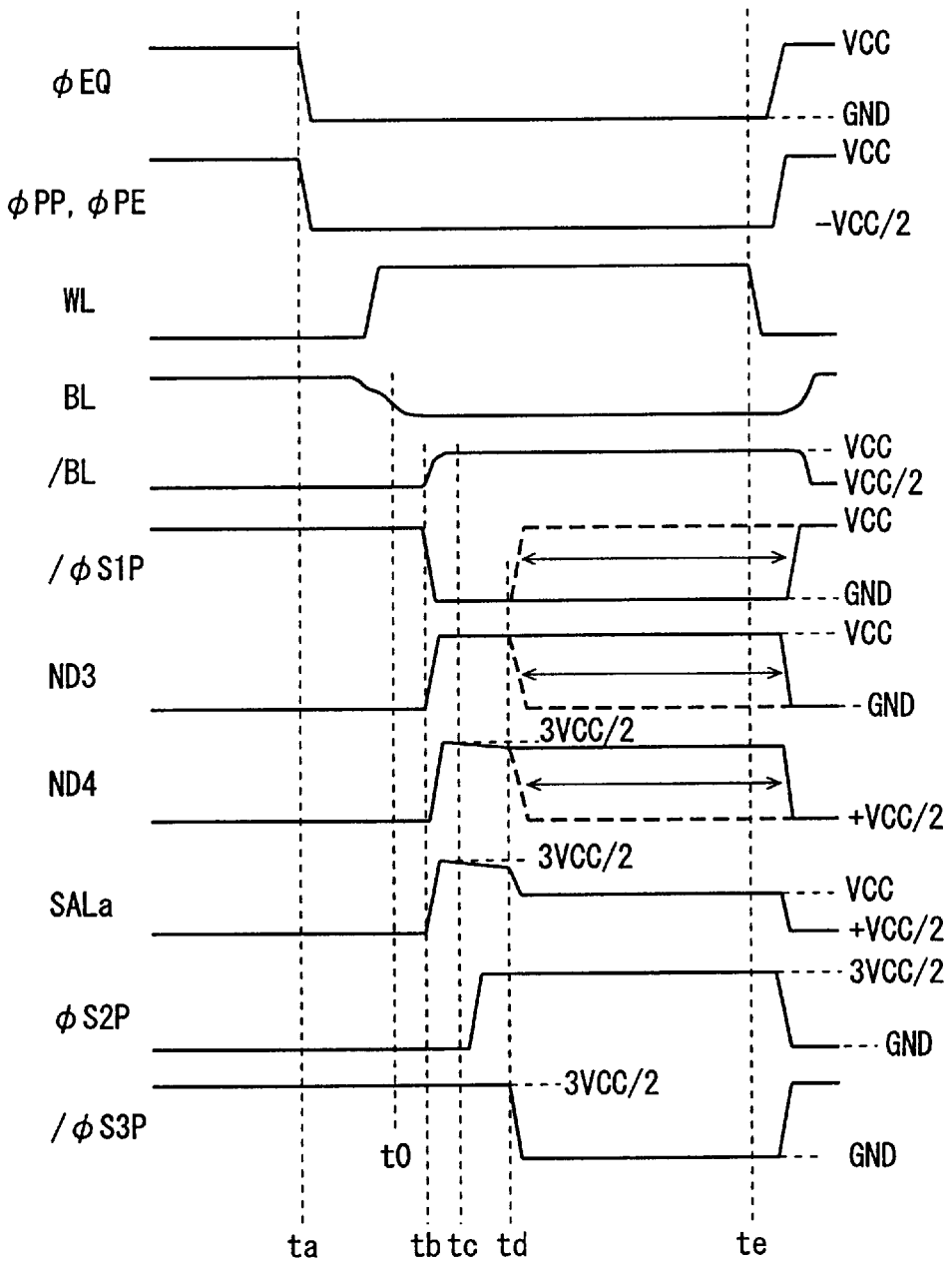
FIG. 23 is a signal waveform diagram representing operations of the structure shown in FIG. 20.

Then, circuitry (not shown) performs the row selecting operation, and word line WL arranged corresponding to the addressed row is driven to the selected state. When the voltage on selected word line WL rises, the storage data of memory cell MC is transmitted onto bit line BL. FIG. 23 shows operation waveforms in a case where L-level data is read onto bit line BL.

Then, N-sense drive control circuit 4n is activated at time t0, and the voltage level on bit line BL at a lower potential is driven to the ground voltage level. At time tb, sense control signal φS1P lowers from power supply voltage VCC level to ground voltage GND level, and driver 104 raises the voltage level on node ND3 from ground voltage GND level to power supply voltage VCC level. Coupling capacitance element C2 transmits this voltage change on node ND3 to node ND4. Sense control signal φSP2 is at the ground voltage level, and MOS transistor QP3 is on so that the charges transmitted onto node ND4 are further transmitted onto sense drive line SALa, and the voltage level on sense drive line SALa rises from the voltage level of intermediate voltage of VCC/2 to the voltage level of 3·VCC/2 at the maximum. In accordance with rise in voltage level on sense drive line SALa, P-sense amplifier (MOS transistors PT1 and PT2) included in sense amplifier SA is activated, and responsively the voltage level on bit line /BL at a higher potential rapidly rises from the intermediate voltage level of VCC/2 to the power supply voltage VCC level.

When the voltage level on bit line /BL rises to power supply voltage VCC level, sense drive control signal φS2P rises to H-level (i.e., the voltage level of 3·VCC2) at time tc, and MOS transistor QP3 is turned off and node ND4 is isolated from sense drive line SALa to prevent application of a voltage higher than VCC/2 to the memory cell capacitor due to driving of bit line /BL to or above the power supply voltage.

At time td, sense control signal /(S3P lowers from the voltage level of 3·VCC/2 to the ground voltage GND level, and MOS transistor QP2 is turned on, and sense drive line SALa is fixed to power supply voltage VCC level corresponding to the H-level data, and power supply voltage VCC is stably supplied onto bit line /BL.

At time te, the memory cycle is completed. The voltage level on selected word line WL lowers, and memory cell MC is isolated from bit line BL. Then, the control signals are driven to the voltage levels similar to those in the standby cycle in a predetermined sequence.

In the signal waveform diagram of FIG. 23, sense control signal /φS1P may be driven to H-level after sense control signal (S2P rises to H-level (high voltage level of 3·VCC2).

In P-sense drive circuit 4p, MOS transistors QP2 and QP3 receive on their gates the control signal of the high voltage of 3·VCC2, similarly to the foregoing embodiment. A selected word line WL is usually driven to high voltage VPP level. Therefore, MOS transistors of the same structures as the access transistor included in memory cell MC can be used as MOS transistors QP2 and QP3, to secure reliability thereof. This applies to MOS transistors QN2 and QN3 included in n-sense drive control circuit 4n.

Figure 24:
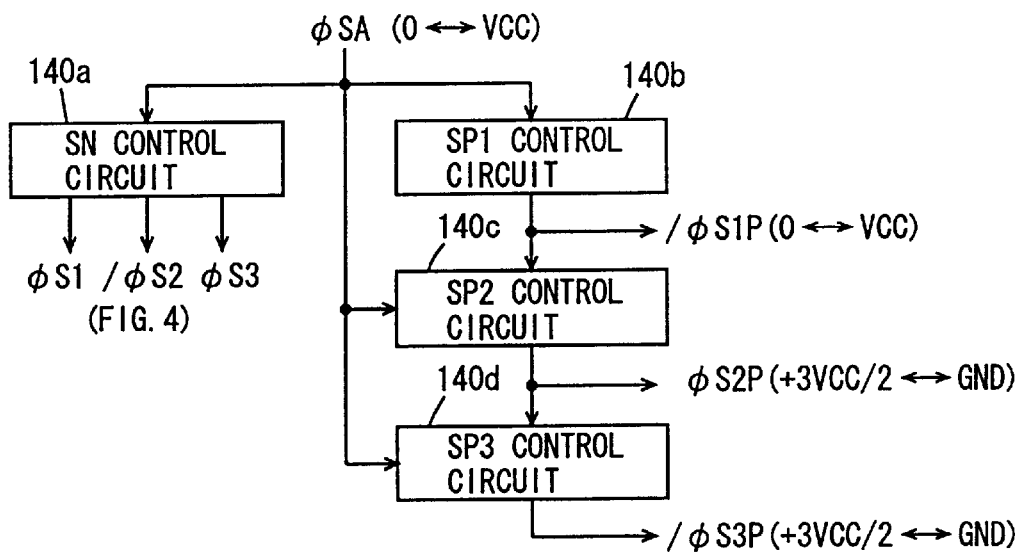
FIG. 24 schematically shows a structure of a portion for generating control signals shown in FIG. 22.

FIG. 24 schematically shows a structure of a portion for generating the sense control signals. In FIG. 24, the sense drive signal generating portion includes an SN control circuit 140a for producing sense control signals φS1, /φS2 and φS3 for the n-sense drive control circuit in accordance with sense activating signal φSA, a PSi control circuit 140b for producing sense control signal /φS1P in accordance with sense activating signal φSA, a PS2 control circuit 140c for producing sense control signal φS2P in accordance with sense control signal /φS1P from PS1 control circuit 140b, and a PS3 control circuit 140d for producing a sense control signal /φS3P in accordance with sense control signal φS2P from PS2 control circuit 140c.

Sense control signals φS2P and /φS3P change between the level of ground voltage GND and the level of high voltage of 3·VCC2. Accordingly, control circuits 140c and 140d have the function of converting the voltage level. PS2 and PS3 control circuits 140c and 140d also receive sense activating signal φSA, and sense control signals φS2P and /φS3P are made inactive when sense activating signal φSA is made inactive. Therefore, the sense control signal generating portion for the P-sense amplifier shown in FIG. 24 achieves the operation represented by the signal waveforms depicted with solid line in FIG. 23.

SN control circuit 140a has the structure similar to that including control circuits 40b–40d shown in FIG. 4.

Sense control signals /φS1P, φS2P and /φS3P may be combined with the sense block specifying signal or global sense block specifying signal, whereby the operation of sense drive control circuit can be controlled on a sense block basis or on a global sense block basis. Therefore, P-sense drive control circuit 4p may be configured into a structure similar to that of N-sense drive control circuit 4 as already described with respect to the foregoing embodiments 3 through 5. If the n-channel MOS transistor in the driver is replaced with a p-channel MOS transistor in the embodiments 3 through 6, the structure for the P-sense drive control circuit can be implemented.

[Modification]

When sense drive line SALa is already precharged to intermediate voltage of VCC/2 and the output signal of driver 104 has an amplitude of power supply voltage VCC, a voltage of VCC/2 is applied between the electrodes of coupling capacitance element C2. A memory cell capacitor can be utilized as coupling capacitance element C2, as is done for the structure of coupling capacitance element C1 already described in the embodiment 2.

Figure 25:
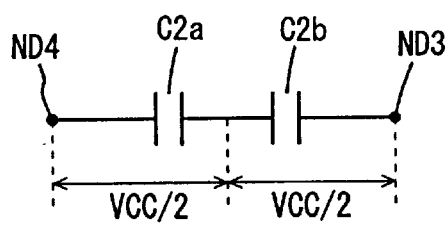
FIG. 25 schematically shows a structure of a modification of the embodiment 6 of the invention.

However, a voltage larger than the intermediate voltage of VCC/2 is applied between the electrodes of coupling capacitance element C2 if the output signal of driver 104 has an amplitude larger than power supply voltage VCC. In this case, as shown in FIG. 25, capacitance elements C2a and C2b are connected in series, and are used as coupling capacitance element C2. If capacitance elements C2a and C2b each have the same structure as the memory cell capacitor, each of capacitance elements C2a and C2b can be supplied with a voltage of VCC/2 at the maximum, and the voltage between nodes ND3 and ND4 can be set to the power supply voltage VCC level at the maximum. Thus, the gate-source voltage of each of MOS transistors PT1 and PT2 in the P-sense amplifier can be made larger than VCC, so that the sense operation can be performed fast. Thus a sense amplifier can be implemented which can operate fast even when the voltage level of power supply voltage VCC is low.

For setting the amplitude of the output signal of output driver 104 to the voltage level of 3·VCC2, it is merely required to apply high voltage Vpp to driver 104 instead of power supply voltage VCC. The structure for making the signal amplitude of the sense drive line larger than power supply voltage VCC may be applied to the N-sense drive control circuit.

According to the embodiment 6 of the invention, as described above, the sense drive line driving the P-sense amplifier is overdriven for a predetermined period when the P-sense amplifier is made active. Therefore, the sense operation can be performed fast even with a low power supply voltage.

Embodiment 7

Figure 26:
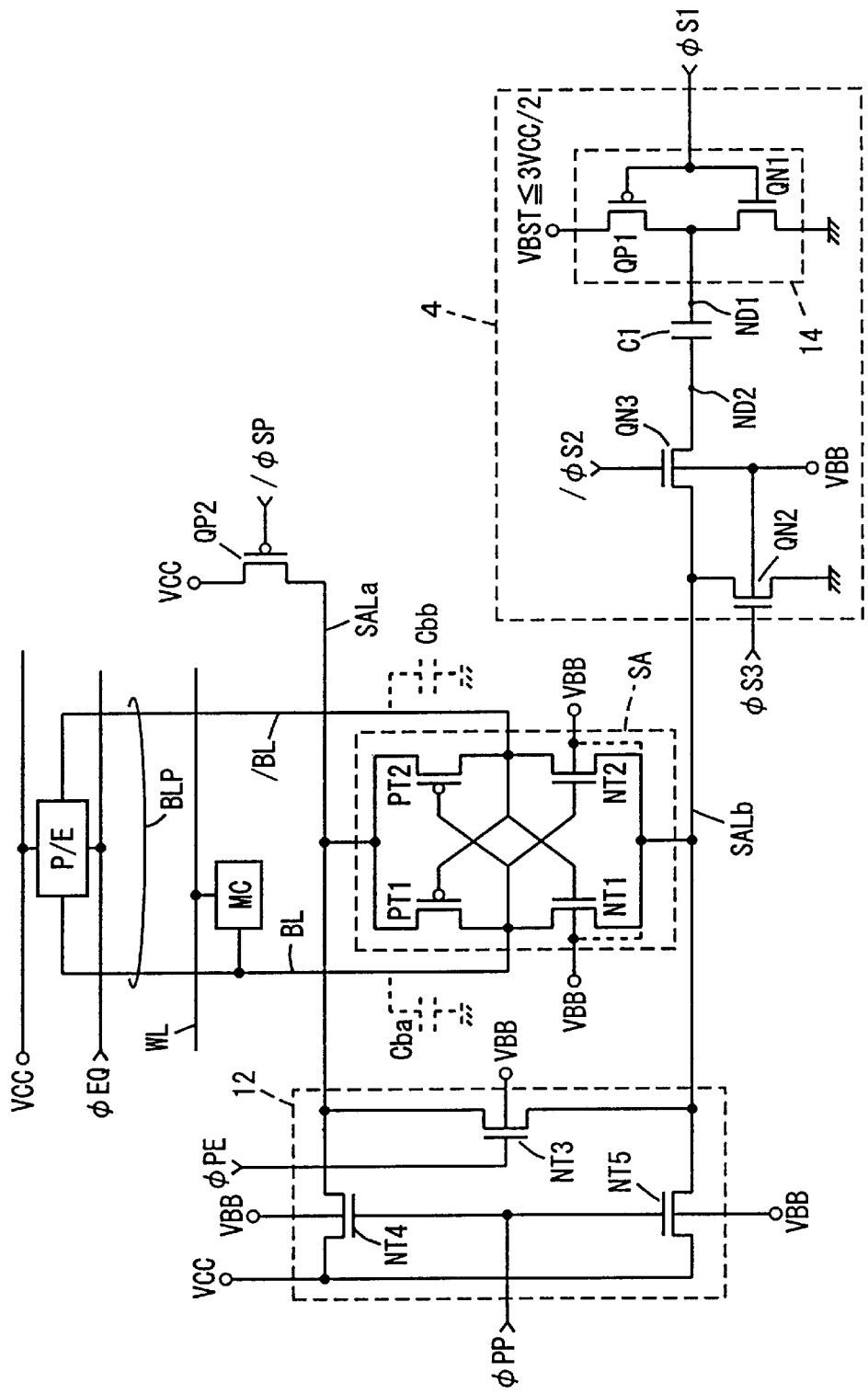
FIG. 26 shows a structure according to an embodiment 7 of the invention.

FIG. 26 shows a structure of an embodiment 7 of the invention. In the structure shown in FIG. 26, bit lines BL and /BL as well as sense drive lines SALa and SALb are precharged to power supply voltage VCC level. In sense drive control circuit 4, driver 14 receives a boosted voltage VBST instead of power supply voltage VCC. Structures other than the above are the same as those shown in FIG. 2 and corresponding portions bear the same reference numerals, and will not be described in detail. Boosted voltage VBST is set to the voltage level of 3·VCC/2 at the maximum so that a voltage higher than intermediate voltage of VCC/2 may not be applied between the electrodes of coupling capacitance element C1.

In the structure shown in FIG. 26, the voltage levels on node ND2 and sense drive line SALb change between power supply voltage VCC and a negative voltage of VCC–VBST ($\geq$–VCC2). In this case, therefore, the voltage of 3·VCC/2 at the maximum is applied across the drain and source of each of transistors NT1 and NT2 forming the N-sense amplifier of sense amplifier SA. Therefore, fast sense operation can be implemented even with a low power supply voltage, similarly to the foregoing embodiments.

Figure 27:
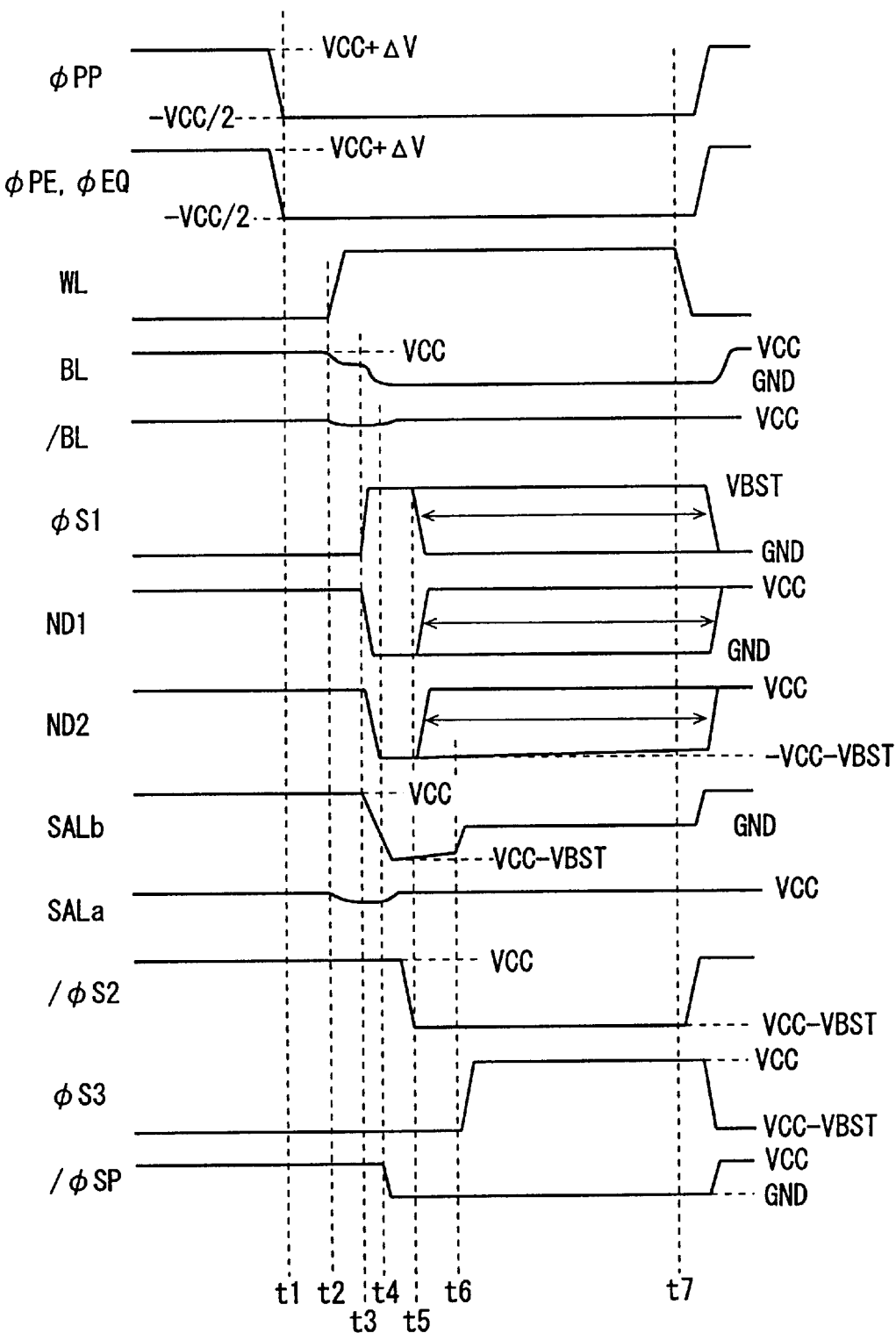
FIG. 27 is a signal waveform diagram representing operations of the structure shown in FIG. 26.

In a signal waveform diagram of FIG. 27, the H-levels of control signals φPP, φPE and φEQ are set to a voltage of (VCC+ΔV) higher than power supply voltage VCC, in order to perform reliable precharging of bit lines BL and /BL as well as sense drive lines SALa and SALb to power supply voltage VCC level, while preventing an influence of the threshold voltages of n-channel MOS transistors arranged in precharge/equalize circuits P/E and 12. Precharge/equalize circuits P/E and 12 may include p-channel MOS transistors as components thereof.

In the signal waveform diagram of FIG. 27, the voltage level on bit line /BL at a higher potential slightly lowers from precharged voltage VCC in data reading. This is because a dummy memory cell is usually connected and causes a voltage change of the intermediate level between H- and L-levels. At the time of this voltage change, sense drive line SALa is electrically floated at the power supply voltage VCC level, so that the charges are consumed, and the voltage level lowers. When P-sense amplifier (transistors PT1 and PT2) are made active, only the so-called restoring operation is performed.

The H-level of control signals φPP, φPT and φEQ may be set to the power supply voltage VCC level, and the precharged voltage levels of bit lines BL and /BL as well as sense drive lines SALa and SALb may be set to a voltage level slightly lower than power supply voltage VCC. For correct operation under this condition, it is merely required to apply a voltage larger than the power supply voltage between the gate and the source of each MOS transistor forming sense amplifier SA in the sense operation of sense amplifier SA.

In this embodiment 7, P-sense drive control circuit may be arranged for P-sense drive line SALa driving the P-sense amplifier, and sense drive line SALa may be overdriven to the voltage level higher than power supply voltage VCC. In the P-sense drive control circuit 4p having the structure shown in FIG. 22, driver 104 may be supplied with boosted voltage VBST instead of power supply voltage VCC as its operation power supply voltage.

In the embodiment 7, the sense drive control circuit may have a structure similar to those of the embodiments 4 and 5, and the P-sense drive control circuit may have a structure similar to those of the embodiments 4 and 5.

The control signal generating portion may have a structure similar to that shown in FIG. 2. Control signal φS1 is adapted to change between boosted voltage VBST and ground voltage GND, and control signals /φS2 and φS3 are adapted to change between power supply voltage VCC and negative voltage of (VCC–VBST). By changing the voltage level to be level-converted by the level converting circuit, the structure shown in FIG. 4 can be used in the embodiment 7.

The bit line may be precharged to a voltage level near power supply voltage VCC level.

According to the embodiment 7 of the invention, as described above, the precharged level is equal to the power supply voltage level, and the driver for driving the coupling capacitance element in the sense drive control circuit is supplied with the boosted voltage higher than the power supply voltage as the operation power supply voltage. In the sense operation, the sense drive line can be overdriven to apply a voltage higher than the power supply voltage across the drain and source of the transistor in the sense amplifier. Accordingly, fast sense operation can be implemented even with a low power supply voltage.

Embodiment 8

Figure 28:
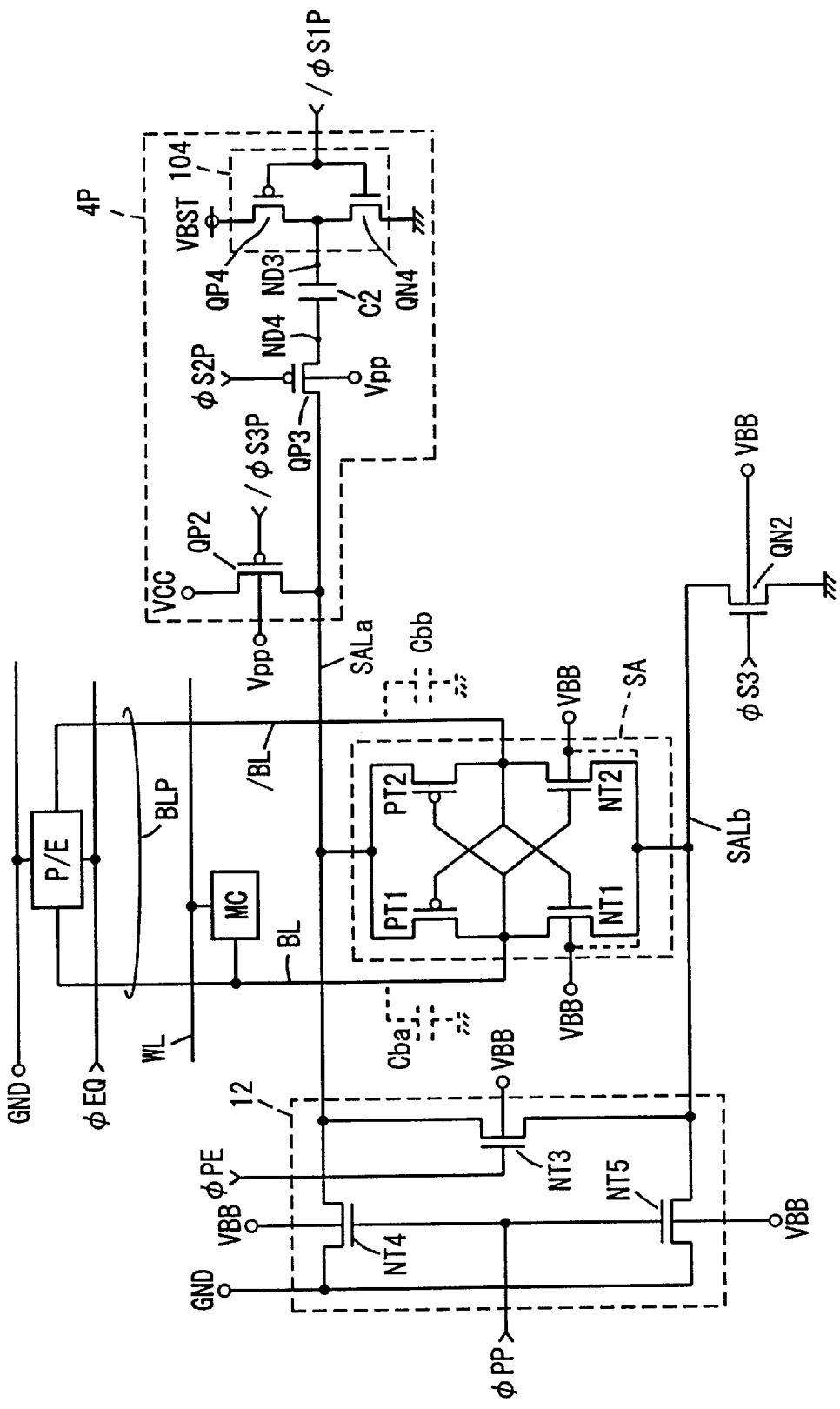
FIG. 28 shows a structure according to an embodiment 8 of the invention.

FIG. 28 shows a structure of an embodiment 8 of the invention. The structure shown in FIG. 28 differs from the structure shown in FIG. 22 in the following operation. N-sense drive line SALb is driven by n-channel MOS transistor QN2 that is turned on in response to sense control signal φS3. Overdriving of sense drive line SALb is not performed. In P-sense drive control circuit 4p driving P-sense drive line SALa, driver 104 receives boosted voltage VBST as its operation power supply voltage. Bit lines BL and /BL as well as sense drive lines SALa and SALb are precharged to ground voltage GND. Structures other than the above are the same as those shown in FIG. 22, and corresponding portions bear the same reference numerals, and will not be described.

Figure 29:
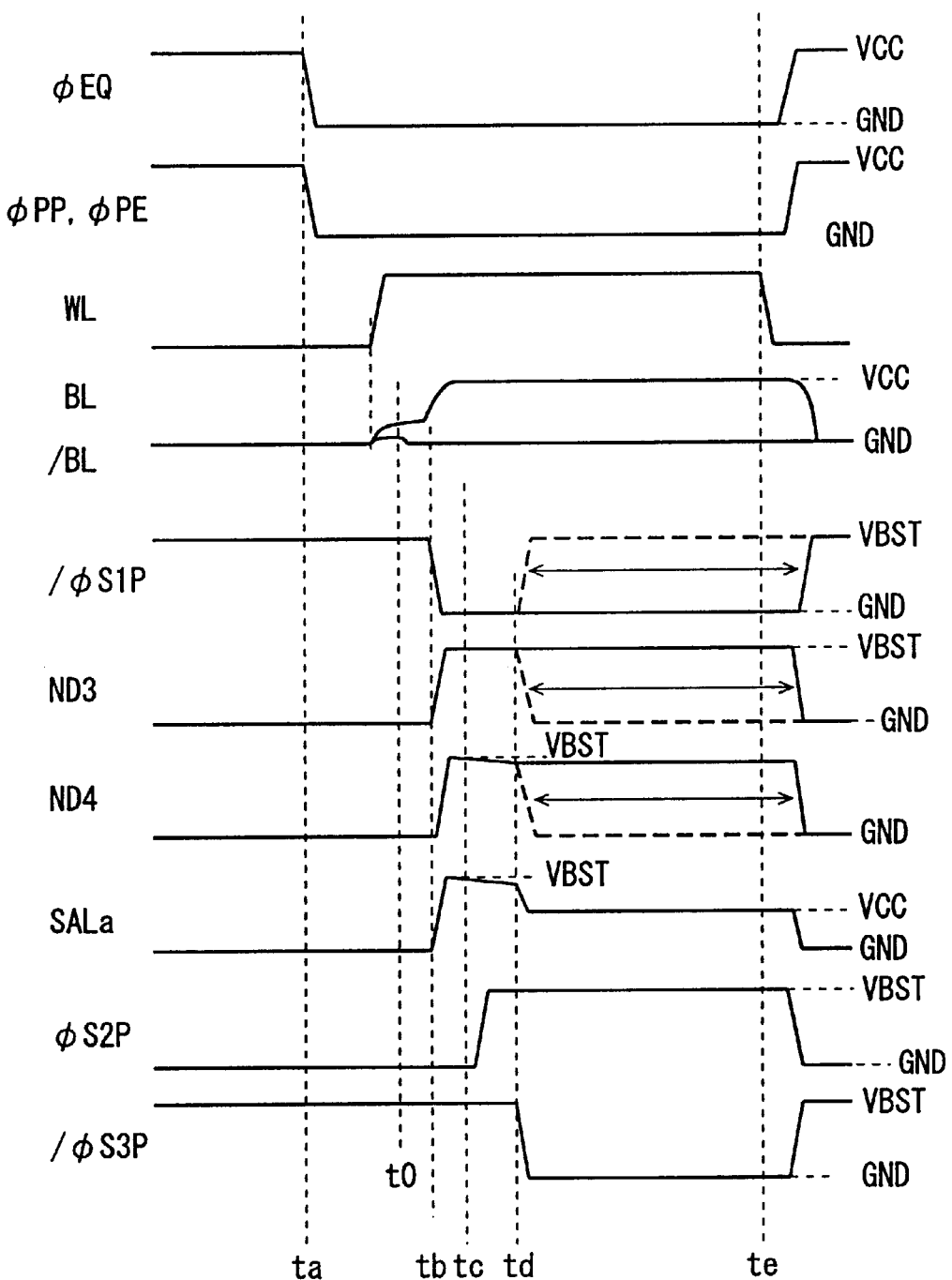
FIG. 29 is a signal waveform diagram representing operations of the structure shown in FIG. 28.

FIG. 29 shows operations waveforms of the structure shown in FIG. 28. As shown in FIG. 29, the levels on nodes ND3 and ND4 in P-sense drive control circuit 4p change between ground voltage GND and boosted voltage VBST. Bit lines BL and /BL are precharged and equalized to the ground voltage GND level. When H-level data is read out, the voltage level on the bit line becomes higher than the voltage level on the bit line onto which data is read from the dummy cell.

Then, N-sense drive line SALb is fixed to the ground voltage level, and the bit line at a lower potential is stably fixed to the ground voltage level. Then, P-sense drive circuit 4p overdrives sense drive line SALa, and the P-sense amplifier performs the sense operation, so that the bit line at a higher potential is driven to power supply voltage VCC level. When sense control signal lφS1P falls from boosted voltage VBST to ground voltage GND at time tb, the voltage level on node ND3 rises to boosted voltage VBST, and the voltage level on node ND4 rises to the level of boosted voltage VBST via coupling capacitance element C2. Thereby, sense drive line SALa is driven to boosted voltage VBST level, and the P-sense amplifier (transistors PT1 and PT2) performs the sense operation at high speed.

When the bit line voltage rises to power supply voltage VCC level, control signal φS2P rises from ground voltage GND level to boosted voltage VBST level, and node ND4 is isolated from sense drive line SALa. At time td, sense control signal /φS3P falls from boosted voltage VBST level to ground voltage GND level, and sense drive line SALa is fixed to power supply voltage VCC level.

Accordingly, the operation of the portions related to the P-sense amplifier shown in FIG. 28 differs from that represented in signal waveform diagram of FIG. 23 only in signal voltage on the nodes, and is performed substantially in the same manner. High voltage VBST higher than power supply voltage VCC is applied across the source and drain in each of MOS transistors PT1 and PT2 in the P-sense amplifier, and the sense operation can be performed fast.

The boosted voltage VBST is set to the voltage level of 3·VCC/2 at the maximum in view of the breakdown voltage characteristics of the transistors. The potentials on nodes Nd3 and ND4 change the substantially in the same phase, and the potential difference between nodes ND3 and ND4 is substantially 0 V. However, the structures of the embodiments 4 and 5 may be applied to the P-sense drive control circuit, in which case a voltage of (VBST–VCC) is applied between the electrode nodes of coupling capacitance element C2. In this case, a relationship of (VBST≦3·VCC2) may be established, whereby the capacitance element having the same structure as the memory cell capacitor can be utilized as coupled capacitor element C2. However, capacitance elements having the same structures as memory cell capacitor may be connected in series (see FIG. 25), whereby the voltage level of boosted voltage VBST can be set higher than 3·VCC2, taking into account only the breakdown voltage characteristics of coupling capacitance element C2.

In the embodiment 8, the N-sense drive control circuit for N-sense drive line SALb may be formed of the circuit used in the embodiments 4 and 5. In the case of employing such N-sense drive control circuit, boosted voltage VBST may be used as the operation power supply voltage of the N-sense drive control circuit (see the structure in FIG. 26).

According to the embodiment 8 of the invention, as described above, the P-sense drive line driving the P-sense amplifier is overdriven to boosted voltage VBST level higher than power supply voltage VCC, in the structure case where the bit line is precharged to the ground voltage level. Therefore, the sense operation can be performed fast even when the level of power supply voltage VCC is low. The precharged voltage on bit line may be close to the ground voltage. Even in this case, a similar advantageous effect can be achieved.

According to the invention, as described above, the sense drive line is overdriven for a predetermined period in the sense operation. Therefore, the sense operation can be performed fast even with a low power supply voltage without impairing the reliability of the memory cell capacitor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cells arranged at least in one column;
    a bit line pair connected to the memory cells arranged in said one column;
    a sense amplifier coupled to said bit line pair for differentially amplifying voltages on said bit line pair in accordance with a voltage on a sense drive line; and
    a sense drive control circuit coupled to said sense drive line and responsive to activation of a sense operation instructing signal for overdriving said sense drive line to a level exceeding a predetermined voltage level for a predetermined period through capacitive coupling operation of a coupling capacitance element, and thereafter for holding said sense drive line at said predetermined voltage, said bit line pair and said sense amplifier being continuously connected together at least during activation of said sense operation instructing signal.

2. The semiconductor memory device according to claim 1, wherein
    the memory cell includes a memory cell capacitor, and said coupling capacitance element includes a capacitance of a same structure as said memory capacitor; and
    said sense drive control circuit includes a sense drive circuit for driving said coupling capacitance element to supply charges onto said sense drive line for said predetermined period in response to activation of said sense operation instructing signal.

3. The semiconductor memory device according to claim 1, wherein
    said sense drive control circuit further includes a gate element for coupling said sense drive line to a voltage supply source supplying said predetermined voltage after said predetermined period elapses.

4. The semiconductor memory device according to claim 1, wherein
    said sense drive control circuit includes:
        an isolating gate connected between said sense drive line and said coupling capacitance element for connecting said sense drive line to said coupling capacitance element for said predetermined period and for isolating said sense drive line from said coupling capacitance element after elapse of said predetermined period; and
        a driver for driving said coupling capacitance element to transmit charges to said isolating gate in response to activation of said sense operation instructing signal.

5. The semiconductor memory device according to claim 1, wherein
    said sense drive control circuit includes:
        a driver for driving said coupling capacitance element to transmit charges onto said sense drive line in response to activation of said sense operation instructing signal; and
        a gate element coupled to said driver and responsive to activation of said sense operation instructing signal for deactivating said driver for said predetermined period to stop the driving of said coupling capacitance element.

6. The semiconductor memory device according to claim 1, wherein
    said sense drive control circuit includes a driver activated for said predetermined period in response to activation of said sense operation instructing signal, for driving said coupling capacitance element to supply charges onto said sense drive line.

7. The semiconductor memory device according to claim 1, wherein
    said sense drive line includes first and second drive voltage transmission lines for transmitting a voltage corresponding to H-level data stored in the memory cell and a voltage corresponding to L-level data stored in said memory cell, respectively; and
    said sense drive control circuit is provided for each of said first and second drive voltage transmission lines.

8. The semiconductor memory device according to claim 1, wherein
    said sense drive line includes a first drive voltage transmission line for transmitting a voltage corresponding to H-level data stored in the memory cell, and a second drive voltage transmission line for transmitting a voltage corresponding to L-level data stored in the memory cell, and said sense drive control circuit is provided for one of the first and second drive voltage transmission lines.

9. The semiconductor memory device according to claim 2, wherein
    a drive signal applied from said sense drive circuit to said coupling capacitance element has an amplitude 1.0 through 1.5 times larger than a difference between voltages corresponding to H- and L-levels of storage data of the memory cell, respectively.

10. The semiconductor memory device according to claim 1, wherein said plurality of memory cells are arranged in a matrix of rows and columns, said sense amplifier is arranged corresponding to each of said columns, and said sense drive control circuit is provided commonly to the respective sense amplifiers arranged corresponding said columns.

11. The semiconductor memory device according to claim 1, wherein said plurality of memory cells are arranged in a matrix of rows and columns, said matrix is divided into a plurality of array blocks each having the memory cells in a plurality of columns, and each of the memory cells includes a memory capacitor;

said sense amplifier is arranged corresponding to each of the columns in each of the array blocks;

said sense drive lines are provided corresponding to the array blocks, and each sense drive line includes a plurality of sub-sense drive lines each connected commonly to sense amplifiers in a corresponding array block;

said plurality of array blocks are divided into at least one global block each including a predetermined number of array block(s); and said sense drive control circuit includes;

the coupling capacitance element provided corresponding to said at least one global block, and having a same structure as said memory capacitor, a driver provided corresponding to said coupling capacitance element, for driving the corresponding coupling capacitance element in response to a sense instructing signal generated in accordance with said sense operation instructing signal, and a plurality of gates provided corresponding to said plurality of array blocks, respectively, and turned on to transmit charges from corresponding coupling capacitance elements onto the corresponding sub-sense drive lines in response to said sense operation instructing signal and an array block designating signal.

12. The semiconductor memory device according to claim 3, wherein said gate element includes an insulated gate field effect transistor receiving on a back gate thereof a voltage not smaller in absolute value than a difference between a maximum absolute value of the voltage on said sense drive line and a PN junction contact potential.

13. The semiconductor memory device according to claim 4, wherein said isolating gate includes an insulated gate field effect transistor receiving on a back gate thereof a voltage not smaller in absolute value than a difference between a maximum absolute value of the voltage on said sense drive line and a PN junction contact potential.

14. The semiconductor memory device according to claim 2, wherein the capacitor of said memory cell includes;

a first electrode layer connected to a first impurity region formed at a surface of a semiconductor substrate region, and a second electrode layer formed on said first electrode layer with an insulating film underlaid; and said coupling capacitance element includes, as facing electrode layers, a third electrode layer formed at a same layer as said first electrode layer and connected to a second impurity region having a same impurity concentration as said first layer impurity region, and a fourth electrode layer formed at a same layer as said second electrode layer and facing to said third electrode layer.

15. The semiconductor memory device according to claim 2, wherein said memory cell includes:

an insulated gate field effect transistor having a gate electrode, a first conductive node connected to one of bit lines of said bit line pair, and a second conductive node; and a cell capacitor having a storage node electrode layer connected to said second conductive node, and a cell plate electrode layer facing to said storage node electrode layer with an insulating film laid therebetween; and said coupling capacitance element has a first conductive layer formed at a same layer as said gate electrode, a second conductive layer formed at a same layer as said cell plate electrode layer and connected to said first conductive layer, and a third conductive layer formed on said second conductive layer and at a same layer as said cell plate electrode layer.

16. The semiconductor memory device according to claim 2, wherein said memory cell includes:

an access transistor having a first conductive node connected to a bit line of said bit line pair, and a second conductive node; and a cell capacitor having a storage node electrode layer connected to said second conductive node, and a cell plate electrode layer facing to said storage node electrode layer with an insulating film laid therebetween and arranged above said storage node electrode layer; and said coupling capacitance element includes a first conductive layer formed at a same layer as the bit line, a second conductive layer connected to said first conductive layer and formed at a same layer as said storage node electrode layer, and a third conductive layer arranged at a same layer as said cell plate electrode layer and facing to said second conductive layer.

17. The semiconductor memory device according to claim 1, further comprising circuitry for holding said sense drive line at one of first and second voltages corresponding to H- and L-levels of stored data of the memory cell and a voltage equal to a half of a sum of said first and second voltages in a standby cycle, each of paired bit lines of said bit line pair being held at a same voltage level as said sense drive line in said standby cycle.

* * * * *